US009828665B2

(12) United States Patent
Ikenaga et al.

(10) Patent No.: US 9,828,665 B2
(45) Date of Patent: Nov. 28, 2017

(54) METAL PLATE, METHOD OF MANUFACTURING METAL PLATE, AND METHOD OF MANUFACTURING DEPOSITION MASK BY USE OF METAL PLATE

(71) Applicant: Dai Nippon Printing Co., Ltd., Tokyo (JP)

(72) Inventors: Chikao Ikenaga, Tokyo (JP); Isao Miyatani, Tokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 15/026,009

(22) PCT Filed: Sep. 24, 2014

(86) PCT No.: PCT/JP2014/075168
§ 371 (c)(1),
(2) Date: Mar. 30, 2016

(87) PCT Pub. No.: WO2015/056537
PCT Pub. Date: Apr. 23, 2015

(65) Prior Publication Data
US 2016/0237546 A1    Aug. 18, 2016

(30) Foreign Application Priority Data
Oct. 15, 2013    (JP) .................................. 2013-215061

(51) Int. Cl.
*B44C 1/22*     (2006.01)
*C23C 14/04*    (2006.01)
(Continued)

(52) U.S. Cl.
CPC ............ *C23C 14/042* (2013.01); *C21D 6/001* (2013.01); *C23F 1/00* (2013.01); *C23F 1/02* (2013.01); *C21D 8/00* (2013.01); *C21D 2261/00* (2013.01)

(58) Field of Classification Search
CPC ...... C21D 2261/00; C21D 6/001; C21D 8/00; C23C 14/042; C23C 14/04; C23F 1/00; C23F 1/02
(Continued)

(56) References Cited

U.S. PATENT DOCUMENTS 6,316,869 B1 * 11/2001 Kim ........................ H01J 29/07
313/402
7,524,792 B2    4/2009 Dieterle et al.
(Continued)

FOREIGN PATENT DOCUMENTS

CN    1754968 A     4/2006
CN    101210307 A   7/2008
(Continued)

OTHER PUBLICATIONS

Chinese Office Action (Application No. 201480056293.3) dated Dec. 21, 2016 (with English translation).
(Continued)

*Primary Examiner* — Lan Vinh
(74) *Attorney, Agent, or Firm* — Burr & Brown, PLLC

(57) ABSTRACT

The object of the present invention is to provide a metal plate capable of manufacturing a deposition mask in which dispersion of positions of through-holes is restrained. A thermal recovery rate is defined as parts per million of a difference a distance between to measurement points on a sample before a heat treatment and a distance therebetween after the heat treatment, relative to the distance therebetween before the heat treatment. In this case, an average value of
(Continued)

the thermal recovery rates of the respective samples is not less than −10 ppm and not more than +10 ppm, and (2) a dispersion of the thermal recovery rates of the respective samples is not more than 20 ppm.

10 Claims, 15 Drawing Sheets

(51) Int. Cl.
    *C23F 1/00*     (2006.01)
    *C23F 1/02*     (2006.01)
    *C21D 6/00*     (2006.01)
    *C21D 8/00*     (2006.01)

(58) Field of Classification Search
    USPC .... 216/11, 12, 13, 17, 41, 48, 1; 438/34, 99
    See application file for complete search history.

(56) References Cited

U.S. PATENT DOCUMENTS

| | | | |
|---|---|---|---|
| 7,667,073 | B2 | 2/2010 | Dieterle et al. |
| 2001/0047839 | A1* | 12/2001 | Hatano ................ C21D 8/0205 148/621 |
| 2002/0117241 | A1* | 8/2002 | Etoh .................... C21D 8/0205 148/621 |
| 2003/0228417 | A1* | 12/2003 | Nishikawa ............ C23C 14/042 427/248.1 |
| 2004/0142202 | A1* | 7/2004 | Kinoshita .............. B23K 20/04 428/596 |
| 2007/0051439 | A1 | 3/2007 | Van Der Winden |
| 2008/0157084 | A1 | 7/2008 | Kim et al. |
| 2011/0131792 | A1* | 6/2011 | Kwak .................... H01M 4/13 29/592.1 |

FOREIGN PATENT DOCUMENTS

| | | |
|---|---|---|
| JP | 56-041331 A1 | 4/1981 |
| JP | 08-067914 A1 | 3/1996 |
| JP | 11-229040 A1 | 8/1999 |
| JP | 2002-237254 A1 | 8/2002 |
| JP | 2003-272838 A1 | 9/2003 |
| JP | 2004-039319 A1 | 2/2004 |
| JP | 2005-183153 A1 | 7/2005 |
| JP | 2008-041553 A1 | 2/2008 |
| KR | 10-2005-0100701 A | 10/2005 |
| KR | 10-2006-0021343 A | 3/2006 |

OTHER PUBLICATIONS

Korean Office Action (Application No. 2016-7009298) dated Oct. 17, 2016 (with English translation).
Japanese Office Action (Application No. 2013-215061) dated Dec. 10, 2013 (with English translation).
International Search Report and Written Opinion (Application No. PCT/JP2014/075168) dated Dec. 22, 2014.

* cited by examiner

| | THERMAL RECOVERY RATE | | JUDGMENT RESULT |
|---|---|---|---|
| | AVERAGE VALUE | DISPERSION($3\sigma$) (ppm) | |
| FIRST SAMPLE | −2 | 16 | ACCEPTABLE |
| SECOND SAMPLE | −1 | 13 | ACCEPTABLE |
| THIRD SAMPLE | 0 | 8 | ACCEPTABLE |
| FOURTH SAMPLE | 3 | 26 | UNACCEPTABLE |
| FIFTH SAMPLE | 5 | 3 | ACCEPTABLE |
| SIXTH SAMPLE | 9 | 21 | UNACCEPTABLE |
| SEVENTH SAMPLE | 17 | 9 | UNACCEPTABLE |
| EIGHTH SAMPLE | 18 | 13 | UNACCEPTABLE |
| NINTH SAMPLE | 26 | 16 | UNACCEPTABLE |
| TENTH SAMPLE | 43 | 29 | UNACCEPTABLE |

FIG.21

|  | PRIMARY EFFECT | | | |
|---|---|---|---|---|
|  | AVERAGE VALUE OF TP (mm) | DISPERSION OF TP (3σ) (μm) | PROCESS CAPACITY INDEX Cpk | JUDGMENT RESULT |
| FIRST WINDING BODY | 600.0018 | 9.3 | 1.42 | ACCEPTABLE |
| SECOND WINDING BODY | 600.0012 | 8.3 | 1.66 | ACCEPTABLE |
| THIRD WINDING BODY | 600.0008 | 4.9 | 2.90 | ACCEPTABLE |
| FOURTH WINDING BODY | 599.9985 | 17.7 | 0.76 | UNACCEPTABLE |
| FIFTH WINDING BODY | 599.9968 | 0.5 | 23.60 | ACCEPTABLE |
| SIXTH WINDING BODY | 599.9932 | 8.9 | 0.92 | UNACCEPTABLE |
| SEVENTH WINDING BODY | 599.9899 | 9.2 | 0.53 | UNACCEPTABLE |
| EIGHTH WINDING BODY | 599.9901 | 8.3 | 0.61 | UNACCEPTABLE |
| NINTH WINDING BODY | 599.9855 | 6.7 | 0.07 | UNACCEPTABLE |
| TENTH WINDING BODY | 599.9798 | 19.1 | −0.27 | UNACCEPTABLE |

FIG.22

| | SECONDARY EFFECT | |
|---|---|---|
| | DISPERSION OF CENTRAL POSITION COORDINATE (3σ) (μm) | JUDGMENT RESULT |
| FIRST WINDING BODY | 8.7 | ACCEPTABLE |
| SECOND WINDING BODY | 7.9 | ACCEPTABLE |
| THIRD WINDING BODY | 5.3 | ACCEPTABLE |
| FOURTH WINDING BODY | 12.2 | UNACCEPTABLE |
| FIFTH WINDING BODY | 1.2 | ACCEPTABLE |
| SIXTH WINDING BODY | 12.1 | UNACCEPTABLE |
| SEVENTH WINDING BODY | 14.3 | UNACCEPTABLE |
| EIGHTH WINDING BODY | 13.5 | UNACCEPTABLE |
| NINTH WINDING BODY | 15.3 | UNACCEPTABLE |
| TENTH WINDING BODY | 21.2 | UNACCEPTABLE |

FIG. 23

METAL PLATE, METHOD OF MANUFACTURING METAL PLATE, AND METHOD OF MANUFACTURING DEPOSITION MASK BY USE OF METAL PLATE

BACKGROUND OF THE INVENTION

Field of the Invention

The present invention relates to a metal plate for use in manufacturing a deposition mask with a plurality of through-holes formed therein. In addition, the present invention relates to a method of manufacturing the metal plate. In addition, the present invention relates to a method of manufacturing the mask with a plurality of through-holes formed therein, by use of the metal plate.

Background Art

A display device used in a portable device such as a smart phone and a tablet PC is required to have high fineness, e.g., an image density not less than 300 ppi. In addition, there is increasing demand that the portable device is applicable in the full high-definitions standard. In this case, the image density of the display device needs to be 450 ppi or more.

An organic EL display device draws attention because of its excellent responsibility and low power consumption. A known method of forming pixels of an organic EL display device is a method which uses a deposition mask including through-holes that are arranged in a desired pattern, and forms pixels in the desired pattern. To be specific, a deposition mask is firstly brought into tight contact with a substrate for organic EL display device, and then the substrate and the deposition mask in tight contact therewith are put into a deposition apparatus so as to deposit an organic material and so on. In general, a deposition mask can be manufactured by forming through-holes in a metal plate by means of an etching process using photolithographic technique (for example, Patent Document 1). For example, a resist film is firstly formed on the metal plate. Then, the resist film, with which an exposure mask is in tight contact, is exposed to form a resist pattern. Thereafter, through-holes are formed by etching areas of the metal plate, which are not covered with the resist pattern.

Patent Document 1: JP2004-039319A

SUMMARY OF THE INVENTION

When a film of a deposition material is formed on a substrate with the use of a deposition mask, the deposition material adheres not only to the substrate but also to the deposition mask. For example, some of the deposition material moves toward the substrate along a direction largely inclined with respect to a normal direction of the deposition mask. Such a deposition material reaches a wall surface of a through-hole of the deposition mask and adheres thereto, before it reaches the substrate. In this case, the deposition material is not likely to adhere to an area of the substrate, which is located near the wall surface of the through-hole of the deposition mask, so that a thickness of the deposition material adhered to this area may be smaller than a thickness of another part and/or there may be a part to which no deposition material adheres. Namely, the deposition near the wall surface of the through-hole of the deposition mask may become unstable. Thus, when this deposition mask is used for forming pixels of an organic EL display device, dimensional precision of each pixel and positional precision thereof lower, which lowers luminous efficiency of the organic EL display device.

One of possible solutions to this problem is to reduce a thickness of a metal plate used for manufacturing a deposition mask. This is because, since the thickness of the metal plate is reduced, a height of a wall surface of a through-hole of a deposition mask can be reduced, whereby a rate of a deposition material, which adheres to the wall surface of the through-hole, can be lowered. However, in order to obtain a metal plate with a reduced thickness, it is necessary to increase a reduction ratio upon manufacture of the metal plate by rolling a base metal. The reduction ratio herein means a value obtained by a calculation of (thickness of base metal minus thickness of metal plate)/(thickness of base metal). When a metal is rolled, strain occurs in the rolled metal. Even if the metal is heat-treated such as annealed after being rolled, it is not easy to completely remove the strain for a short period of time. Thus, a metal plate used for manufacturing a deposition mask generally has a strain that remains inside the metal plate, i.e., a remaining strain.

A step using a metal plate to manufacture a deposition mask and a deposition step using the deposition mask respectively include a step of applying heat to the metal plate constituting the deposition mask. At this time, because of the heat, there is a possibility that a remaining stress in the metal plate is removed and/or that a crystalline orientation changes. When the remaining stress is removed and/or the crystalline orientation changes, the dimension of the metal plate may reduce. For example, when the remaining stress is removed, since the material shape held by the remaining stress changes such that there is no strain as much as possible, the dimension of the metal plate may reduce. On the other hand, when the crystalline orientation changes, the crystalline density changes to higher the density, the dimension of the metal plate may reduce.

The fact that the dimension of the metal plate constituting a deposition mask may change means that positions of through-holes formed in the deposition mask may change by means of heat. In addition, there is a possibility that the degree of remaining strain inside the metal plate changes in the width direction of the metal plate. In this case, the degree at which the positions of the through-holes change by heat differs depending on a position in the width direction of the original elongated metal plate where the metal plate constituting the deposition mask occupies. This means not only that the positions of the through-holes formed in the deposition mask change by heat, but also that the degree of change differs in each individual deposition mask. Thus, in order to precisely set the positions of the through-holes in each deposition mask, it is important to use, as an original elongated metal plate, an elongated metal plate having a small remaining strain degree and its dispersion. Such a problem is not recognized in the above Patent Document 1.

The present invention has been made in view of the above circumstances. The object of the present invention is to provide a metal plate used for manufacturing a deposition mask having through-holes that are formed with high positioning precision. In addition, the object of the present invention is to provide a method of manufacturing a metal plate and a method of manufacturing a mask.

The present invention is a method of manufacturing a metal plate to be used for manufacturing a deposition mask by forming a plurality of through-holes in the metal plate, the method comprising:

a rolling step of rolling a base metal to obtain the metal plate; and an annealing step of annealing the metal plate obtained by the rolling step;

wherein:
the through-holes of the deposition mask are formed by etching the elongated metal plate,
when a plurality of samples are taken out from the metal plate, a distance between two measurement points on each sample, which is measured before a heat treatment, is referred to as L1, a distance therebetween which is measured after the heat treatment is referred to as L2, and a thermal recovery rate F of each sample is defined by the following expression: $F=\{(L1-L2)/L1\}\times 10^6$ (ppm), the following conditions (1) and (2) are satisfied:
  (1) an average value of the thermal recovery rates of the respective samples is not less than −10 ppm and not more than +10 ppm; and
  (2) a dispersion of the thermal recovery rates of the respective samples is not more than 20 ppm;
the samples are obtained by cutting at least one sample metal plate, which is obtained by cutting the metal plate along a width direction of the metal plate, into two or more along a longitudinal direction of the metal plate;
the two measurement points on the sample are aligned along the longitudinal direction of the metal plate;
the heat treatment includes a first step of increasing a temperature of each sample from 25° C. to 300° C. for 30 minutes, a second step of keeping the temperature of each sample at 300° C. for 5 minutes, and a third step of decreasing the temperature of each sample from 300° C. to 25° C. for 60 minutes; and
the dispersion of the thermal recovery rates is a value obtained by multiplying 3 to a standard deviation of the thermal recovery rates of the respective samples.

In the method of manufacturing a metal plate, the annealing step may be performed while pulling the rolled base metal in the longitudinal direction. Alternatively, the annealing step may be performed to the metal plate wound around a core.

In the method of manufacturing a metal plate, the base metal may include an invar alloy.

The present invention is a metal plate to be used for manufacturing a deposition mask by forming a plurality of through-holes in the metal plate,
wherein:
the through-holes of the deposition mask are formed by etching the elongated metal plate,
when a plurality of samples are taken out from the metal plate, a distance between two measurement points on each sample, which is measured before a heat treatment, is referred to as L1, a distance therebetween which is measured after the heat treatment is referred to as L2, and a thermal recovery rate F of each sample is defined by the following expression: $F=\{(L1-L2)/L1\}\times 10^6$ (ppm), the following conditions (1) and (2) are satisfied:
  (1) an average value of the thermal recovery rates of the respective samples is not less than −10 ppm and not more than +10 ppm; and
  (2) a dispersion of the thermal recovery rates of the respective samples is not more than 20 ppm;
the samples are obtained by cutting at least one sample metal plate, which is obtained by cutting the metal plate along a width direction of the metal plate, into two or more along a longitudinal direction of the metal plate;
the two measurement points on the sample are aligned along the longitudinal direction of the metal plate;
the heat treatment includes a first step of increasing a temperature of each sample from 25° C. to 300° C. for 30 minutes, a second step of keeping the temperature of each sample at 300° C. for 5 minutes, and a third step of decreasing the temperature of each sample from 300° C. to 25° C. for 60 minutes; and
the dispersion of the thermal recovery rates is a value obtained by multiplying 3 to a standard deviation of the thermal recovery rates of the respective samples.

The metal plate according to the present invention may include an invar alloy.

The present invention is a method of manufacturing a deposition mask having a plurality of through-holes formed therein, comprising:
a step of preparing a metal plate;
a resist pattern forming step of forming a resist pattern on the metal plate; and
an etching step of etching an area of the metal plate, which is not covered with the resist pattern, to form recesses in the metal plate, the recesses being configured to define the through-holes;
wherein:
when a plurality of samples are taken out from the metal plate, a distance between two measurement points on each sample, which is measured before a heat treatment, is referred to as L1, a distance therebetween which is measured after the heat treatment is referred to as L2, and a thermal recovery rate F of each sample is defined by the following expression: $F=\{(L1-L2)/L1\}\times 10^6$ (ppm), the following conditions (1) and (2) are satisfied:
  (1) an average value of the thermal recovery rates of the respective samples is not less than −10 ppm and not more than +10 ppm; and
  (2) a dispersion of the thermal recovery rates of the respective samples is not more than 20 ppm;
the samples are obtained by cutting at least one sample metal plate, which is obtained by cutting the metal plate along a width direction of the metal plate, into two or more along a longitudinal direction of the metal plate;
the two measurement points on the sample are aligned along the longitudinal direction of the metal plate;
the heat treatment includes a first step of increasing a temperature of each sample from 25° C. to 300° C. for 30 minutes, a second step of keeping the temperature of each sample at 300° C. for 5 minutes, and a third step of decreasing the temperature of each sample from 300° C. to 25° C. for 60 minutes; and
the dispersion of the thermal recovery rates is a value obtained by multiplying 3 to a standard deviation of the thermal recovery rates of the respective samples.

In the method of manufacturing a deposition mask according to the present invention, the resist-pattern forming step may include:
a step of forming a resist film on the metal plate;
a step of bringing an exposure mask into vacuum contact with the resist film;
a step of exposing the resist film in a predetermined pattern through the exposure mask; and
a developing step of forming an image on the exposed resist film;
wherein the developing step includes a resist heat treatment step of increasing a hardness of the resist film.

In the method of manufacturing a deposition mask according to the present invention, the metal plate may include an invar alloy.

According to the present invention, a deposition mask having a restrained dispersion of positions of through-holes can be obtained. Thus, positioning precision of a deposition material adhered to a substrate can be improved.

BRIEF DESCRIPTION OF THE DRAWINGS

FIG. 9B (b) is a plan view showing the sample after it is subjected to the heat treatment.

FIG. 21 is a view showing measurement results of thermal recovery rates of first to tenth samples cut from first to tenth winding bodies.

FIG. 22 is a view showing evaluation results of a primary effect in deposition masks manufactured by elongated metal plates obtained from the first to the tenth winding bodies.

FIG. 23 is a view showing evaluation results of a secondary effect in the deposition masks manufactured by the elongated metal plates obtained from the first to tenth winding bodies.

DETAILED DESCRIPTION OF THE INVENTION

Figure 1:
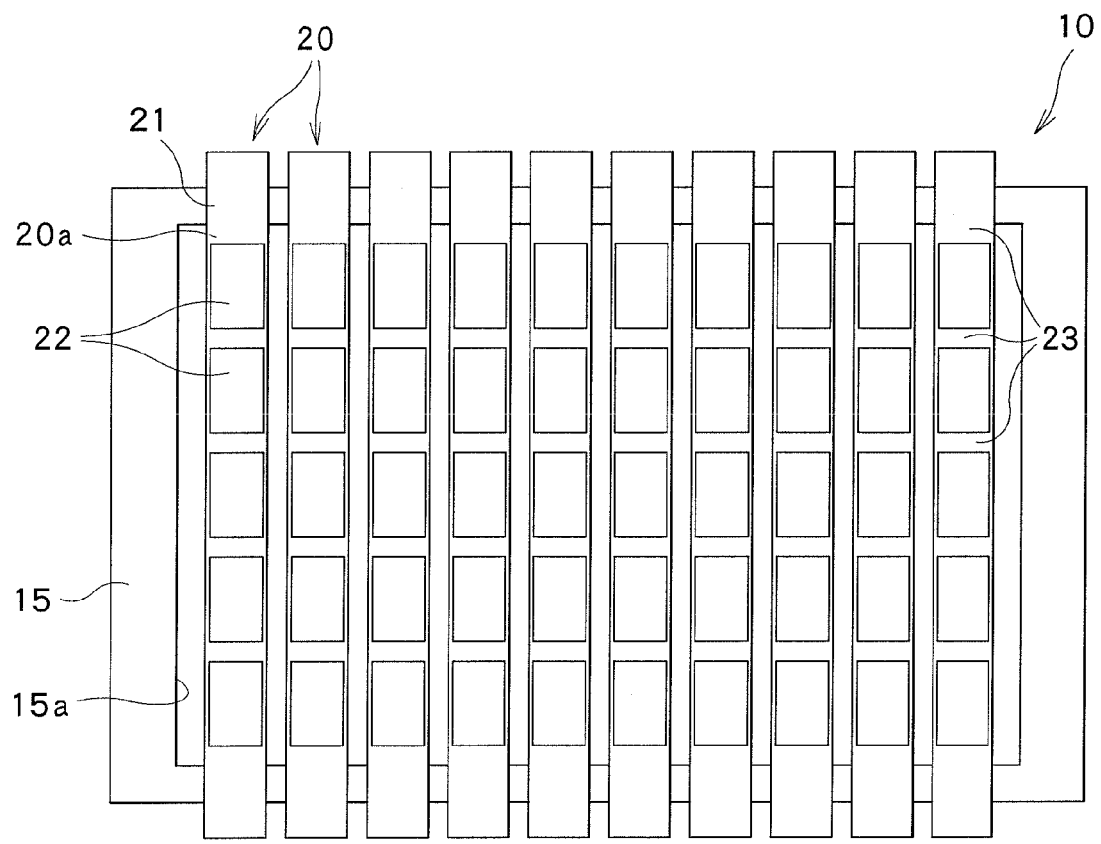
FIG. 1 is a view for explaining an embodiment of the present invention, which is a schematic plan view showing an example of a deposition mask apparatus including deposition masks.

An embodiment of the present invention will be described herebelow with reference to the drawings. In the drawings attached to the specification, a scale dimension, an aspect ratio and so on are changed and exaggerated from the actual ones, for the convenience of easiness in illustration and understanding.

FIGS. 1 to 19 are drawings for explaining an embodiment of the present invention. In the below embodiment and its modification examples, a method of manufacturing a deposition mask, which is used for patterning an organic material in a desired pattern on a substrate when an organic EL display device is manufactured, is described by way of example.

However, not limited to this application, the present invention can be applied to a method of manufacturing a deposition mask to be used in various applications.

In this specification, the terms "plate", "sheet" and "film" are not differentiated from one another based only on the difference of terms. For example, the "plate" is a concept including a member that can be referred to as sheet or film. Thus, for example, "metal plate" is not differentiated from a member that is referred to as "metal sheet" or "metal film" based only on the difference of terms.

In addition, the term "plate plane (sheet plane, film plane)" means a plane corresponding to a plane direction of a plate-like (sheet-like, film-like) member as a target, when the plate-like (sheet-like, film-like) member as a target is seen as a whole in general. A normal direction used to the plate-like (sheet-like, film-like) member means a normal direction with respect to a plate plane (sheet surface, film surface) of the member.

Further, in this specification, terms specifying shapes, geometric conditions and their degrees, e.g., "parallel", "perpendicular", "same", "similar" etc., are not limited to their strict definitions, but construed to include a range capable of exerting a similar function.

(Deposition Mask Apparatus)

Figure 2:
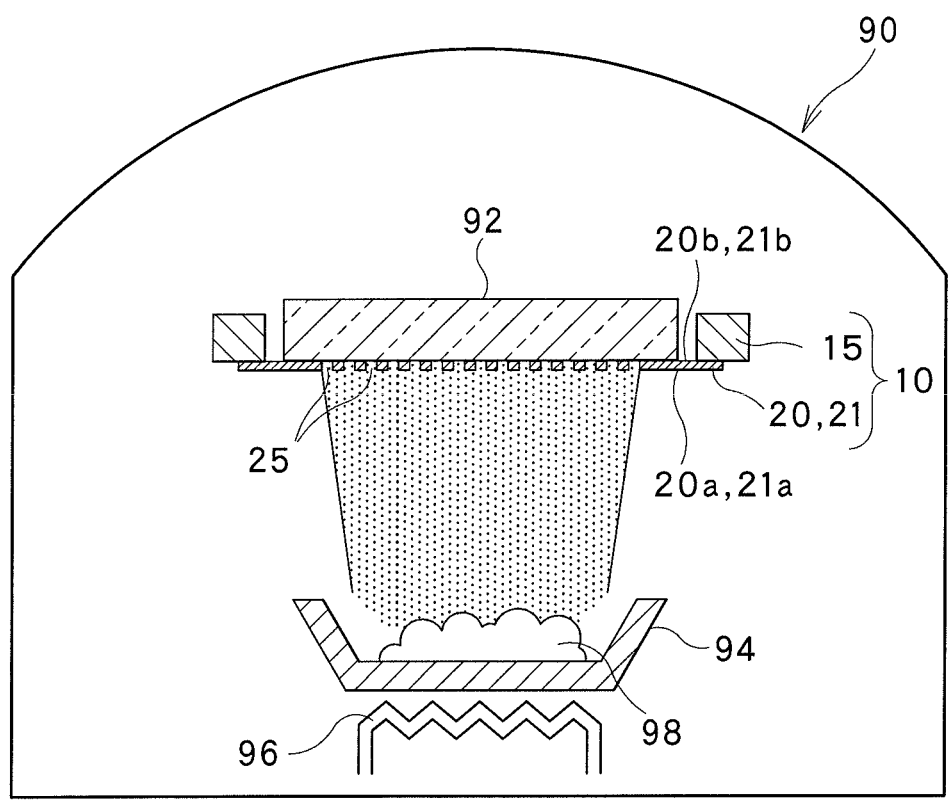
FIG. 2 is a view for explaining a deposition method by use of the deposition mask apparatus shown in FIG. 1.

Firstly, an example of a deposition mask apparatus including deposition masks to be manufactured is described with reference mainly to FIGS. 1 to 6. FIG. 1 a plan view showing an example of the deposition mask apparatus including the deposition masks. FIG. 2 is a view for explaining a method of using the deposition mask apparatus shown in FIG. 1.

Figure 3:
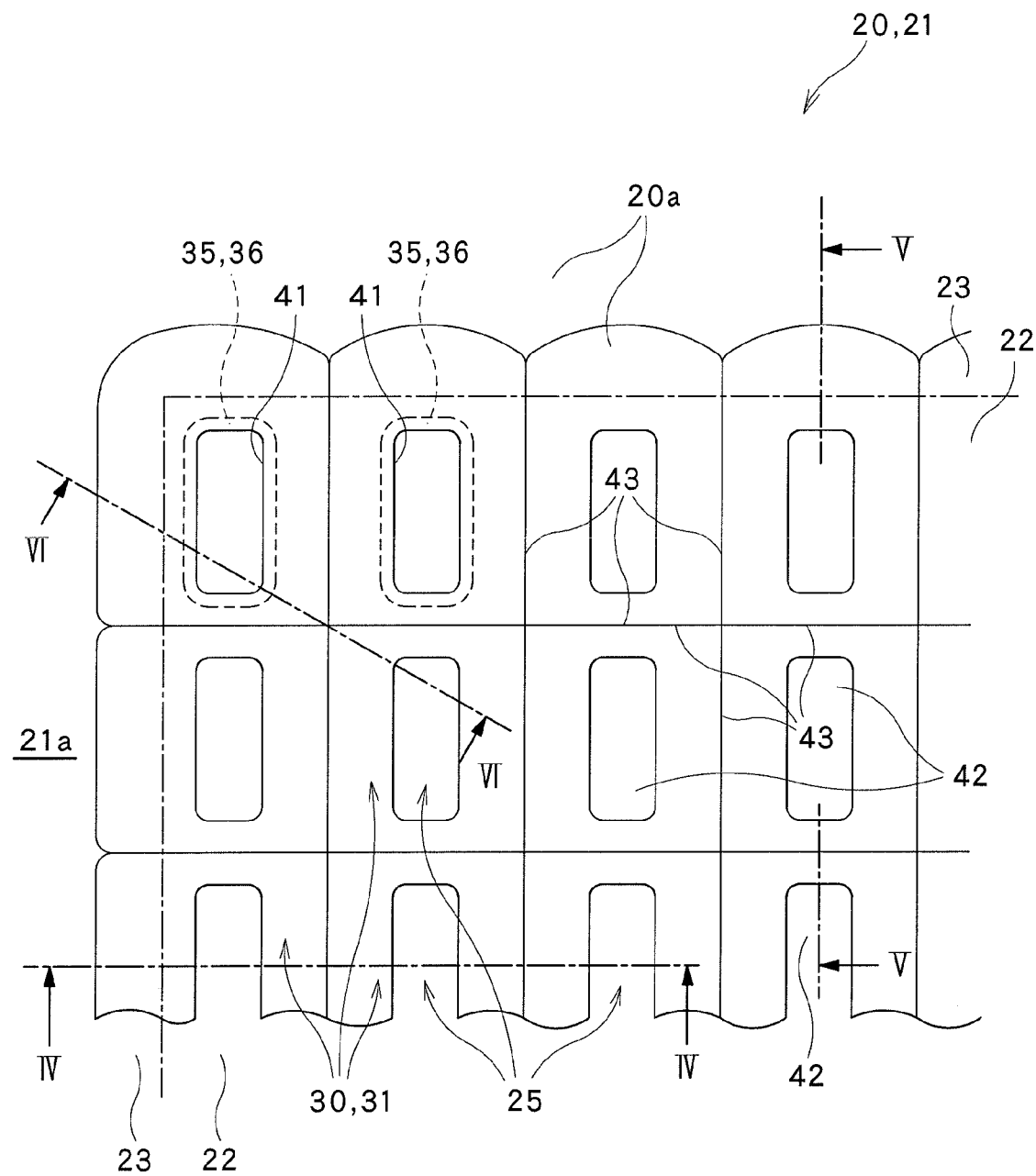
FIG. 3 is a partial plan view showing the deposition mask shown in FIG. 1.
Figure 4:
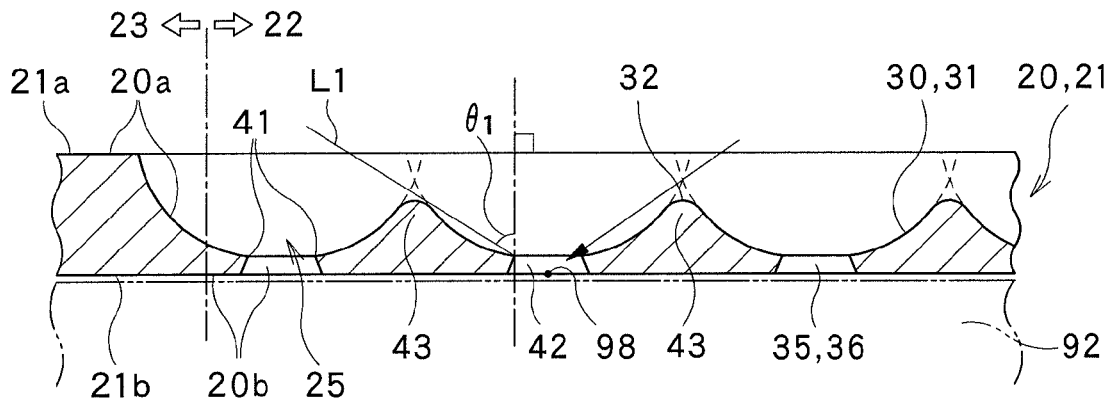
FIG. 4 is a sectional view taken along the line IV-IV of FIG. 3.
Figure 5:
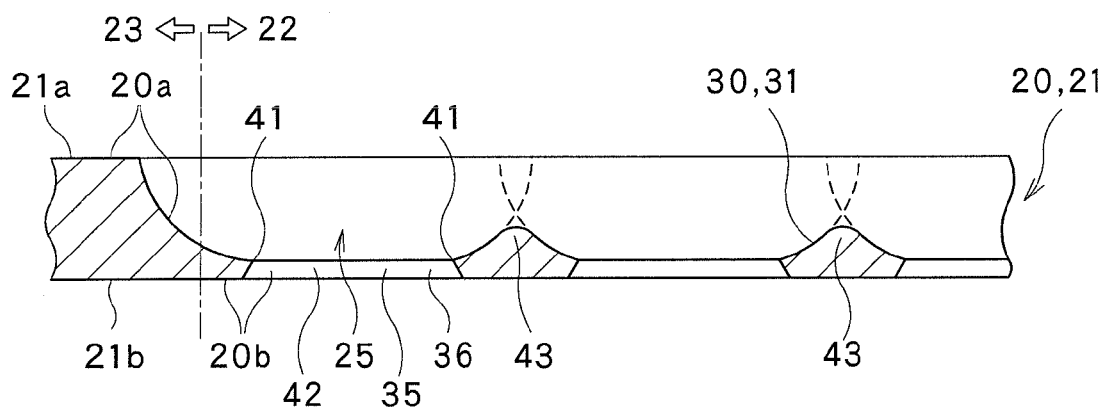
FIG. 5 is a sectional view taken along the line V-V of FIG. 3.
Figure 6:
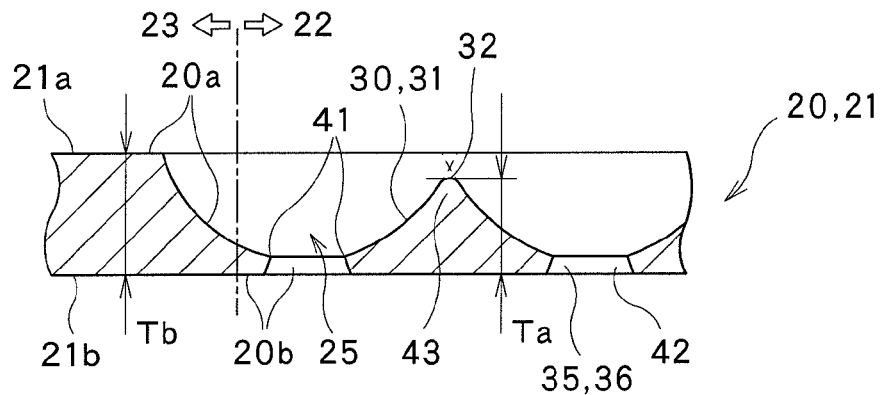
FIG. 6 is a sectional view taken along the line VI-VI of FIG. 3.

FIG. 3 is a plan view showing the deposition mask seen from a first surface side. FIGS. 4 to 6 are sectional views seen from respective positions of FIG. 3.

The deposition mask apparatus 10 shown in FIGS. 1 and 2 includes a plurality of deposition masks 20 each of which is formed of a metal plate 21 of substantially a rectangular shape, and a frame 15 attached to peripheries of the deposition masks 20. Each deposition mask 20 has a number of through-holes 25 formed by etching the metal plate 21, which has a first surface 21a and a second surface 21b opposed to each other, at least from the first surface 21a. As shown in FIG. 2, the deposition mask apparatus 10 is used for depositing a deposition material to a substrate. The deposition mask apparatus 10 is supported in a deposition apparatus 90 such that the deposition mask 20 faces a lower surface of the substrate such as a glass substrate 92, onto which the deposition material is to be deposited.

In the deposition apparatus 90, the deposition mask 20 and the glass substrate 92 are brought into tight contact with each other by a magnetic force of magnets, not shown. In the deposition apparatus 90, there are disposed below the deposition mask apparatus 10 a crucible 94 storing a deposition material (e.g., organic luminescent material) 98 and a heater 96 for heating the crucible 94. The deposition material 98 in the crucible 94 is evaporated or sublimated by heat applied from the heater 96 so as to adhere to the surface of the glass substrate 92. As described above, since the deposition mask 20 has a lot of through-holes 25, the deposition material 98 adheres to the glass substrate 92 through the through-holes 25. As a result, a film of the deposition material 98 is formed on the surface of the glass substrate 92 in a desired pattern corresponding to the positions of the through-holes 25 of the deposition mask 20.

As described above, in this embodiment, the through-holes 25 are arranged in each effective area 22 in a predetermined pattern. When a color display is desired, an organic luminescent material for red color, an organic luminescent material for green color and an organic luminescent material for blue color may be sequentially deposited, while the deposition mask 20 (deposition mask apparatus 10) and the glass substrate 92 are relatively moved little by little along the arrangement direction of the through-holes 25 (aforementioned one direction).

The frame 15 of the deposition mask apparatus 10 is attached to the peripheries of the rectangular deposition masks 20. The frame 15 is configured to hold each deposition mask in a tensed state in order to prevent the deposition mask 20 from warping. The deposition masks 20 and the frame 15 are fixed with respect to each other by spot welding, for example.

The deposition process is performed inside the deposition apparatus 90 in a high-temperature. Thus, during the deposition process, the deposition masks 20, the frame 15 and the substrate 92, which are held inside the deposition apparatus 90, are also heated. At this time, each deposition mask 20, the frame 15 and the substrate 92 develop dimensional change behaviors based on their respective thermal expansion coefficients. In this case, when the thermal expansion coefficients of the deposition mask 20, the frame 15 and the substrate 92 largely differ from one another, positioning displacement occurs because of the difference in dimensional change. As a result, the dimensional precision and the positional precision of the deposition material to be adhered to the substrate 92 lower. In order to avoid this problem, the thermal expansion coefficient of the deposition mask 20 and the frame 15 is preferably equivalent to the thermal expansion coefficient of the substrate 92. For example, when a glass substrate 92 is used as the substrate 92, an invar alloy, which is an iron alloy obtained by adding to iron a predetermined amount of nickel, e.g., 36% by mass, may be used as a material of the deposition mask 20 and the frame 15.

(Deposition Mask)

Next, the deposition mask 20 is described in detail. As shown in FIG. 1, in this embodiment, each deposition mask 20 is formed of the metal plate 21, and has an outline of a substantially quadrangular shape in plan view, more precisely, a substantially rectangular shape in plan view. The metal plate 21 of the deposition mask 20 includes the effective area 22 in which the through-holes 25 are formed in a regular arrangement, and a surrounding area 23 surrounding the effective area 22. The surrounding area 23 is an area for supporting the effective area 22, and is not an area through which the deposition material intended to be deposited on the substrate passes. For example, in the deposition mask 20 for use in depositing an organic luminescent material for organic EL display device, the effective area 22 is an area in the deposition mask 20, which faces a section on the substrate (glass substrate 92) to which the organic luminescent material is deposited to form pixels, i.e., a section on the substrate which provides a display surface of the manufactured substrate for organic EL display device. However, for various reasons, the surrounding area 23 may have a through-hole and/or a recess. In the example shown in FIG. 1, each effective area 22 has an outline of a substantially quadrangular shape in plan view, more precisely, a substantially rectangular shape in plan view.

In the illustrated example, the effective areas 22 of the deposition masks 20 are aligned in line, at predetermined intervals therebetween, along one direction in parallel with a longitudinal direction of the deposition mask 20. In the illustrated example, one effective area 22 corresponds to one organic EL display device. Namely, the deposition mask apparatus 10 (deposition masks 20) shown in FIG. 1 enables a multifaceted deposition.

As shown in FIG. 3, in the illustrate example, a plurality of the through-holes 25 formed in each effective area 22 are arranged at predetermined pitches along two directions perpendicular to each other. An example of the through-hole 25 formed in the metal plate 21 is described in more detail with reference mainly to FIGS. 3 to 6.

As shown in FIGS. 4 to 6, a plurality of the through-holes 25 extend between the first surface 20a, which is one side along a normal direction of the deposition mask 20, and the second surface 20b, which is the other side along the normal direction of the deposition mask 20, to pass through the deposition mask 20. In the illustrated example, as described in more detail later, a first recess 30 is formed in the metal plate 21 by an etching process from the side of the first surface 21a of the metal plate 21, which is the one side in the normal direction of the deposition mask, and a second recess 35 is formed in the metal plate 21 from the side of the second surface 21b, which is the other side in the normal direction of the metal plate 21. The through-hole 25 is composed of the first recess 30 and the second recess 35.

As shown in FIGS. 3 to 6, a cross-sectional area of each first recess 30, in a cross section along a plate plane of the deposition mask 20 at each position along the normal direction of the deposition mask 20, gradually decreases from the side of the first surface 20a of the deposition mask 20 toward the side of the second surface 20b. As shown in FIG. 3, a wall surface 31 of the first recess 30 extends in its all area in a direction intersecting with the normal direction of the deposition mask 20, and is exposed to the one side along the normal direction of the deposition mask 20.

Similarly, a cross-sectional area of each second recess 35, in a cross section along the plate plane of the deposition mask 20 at each position along the normal direction of the deposition mask 20, may gradually decrease from the side of the second surface 20b of the deposition mask 20 toward the side of the first surface 20a. A wall surface 36 of the second recess 35 extends in its all area in a direction intersecting with the normal direction of the deposition mask 20, and is exposed to the other side along the normal direction of the deposition mask 20.

As shown in FIGS. 4 to 6, the wall surface 31 of the first recess 30 and the wall surface 36 of the second recess 35 are connected via a circumferential connection portion 41. The connection portion 41 is defined by a ridge line of a bulging part where the wall surface 31 of the first recess 30, which inclined with respect to the normal direction of the deposition mask 20, and the wall surface 36 of the second recess 35, which is inclined with respect to the normal direction of the deposition mask 20, are merged with each other. The connection portion defines a through portion 42 where an area of the through-hole 25 is minimum in plan view of the deposition mask 20.

As shown in FIGS. 4 to 6, the two adjacent through-holes 25 in the other side surface along the normal direction of the deposition mask, i.e., in the second surface 20b of the deposition mask 20, are spaced from each other along the plate plane of the deposition mask. Namely, as in the below-described manufacturing method, when the second recesses 35 are made by etching the metal plate 21 from the side of the second surface 21b of the metal plate 21, which will correspond to the second surface 20b of the deposition mask 20, the second surface 21b of the metal plate 21 remains between the two adjacent recesses 35.

On the other hand, as shown in FIGS. 4 to 6, the two adjacent first recesses 30 are connected to each other on the one side along the normal direction of the deposition mask, i.e., on the side of the first surface 20a of the deposition mask 20. Namely, as in the below-described manufacturing method, when the first recesses 30 are made by etching the metal plate 21 from the side of the first surface 21a of the metal plate 21, which will correspond to the first surface 20a of the deposition mask 20, no first surface 21a of the metal plate 21 remains between the two adjacent first recesses 30. Namely, the first surface 21a of the metal plate 21 is etched as a whole over the effective area 22. According to the first surface 20a of the deposition mask 20 formed by these first recesses 30, when the deposition mask 20 is used such that the first surface 20a of the deposition mask 20 faces the deposition material 98 as shown in FIG. 2, a utilization efficiency of the deposition material 98 can be effectively improved.

As shown in FIG. 2, the deposition mask apparatus 10 is received in the deposition apparatus 90. In this case, as shown by the two-dot chain lines in FIG. 4, the first surface 20a of the deposition mask 20 is located on the side of the crucible 94 holding the deposition material 98, and the second surface 20b of the deposition mask 20 faces the glass substrate 92. Thus, the deposition material 98 adheres to the glass substrate 92 through the first recess 30 whose cross-sectional area gradually decreases. As shown by the arrow in FIG. 4 the deposition material 98 not only moves from the crucible 94 toward the glass substrate 92 along the normal direction of the glass substrate 92, but also sometimes moves along a direction largely inclined with respect to the normal direction of the glass substrate 92. At this time, when the thickness of the deposition mask 20 is large, most of the diagonally moving deposition material 98 reaches the wall surface 31 of the first recess 30, before the deposition material 98 passes through the through-hole 25 to reach the glass substrate 92. In this case, the area of the glass substrate 92 facing the through-hole 25 has an area where the deposition material 98 is likely to reach, and an area where the deposition material 98 is unlikely to reach. Thus, in order that the utilization efficiency (a film-deposition efficiency: a rate of the deposition material adhering to the glass substrate 92) of the deposition material can be enhanced to save the expensive deposition material, and that a film of the expensive deposition material can be stably and uniformly formed in the desired area, it is important to constitute the deposition mask 20 such that the diagonally moving deposition material 98 is made to reach the glass substrate 92 as much as possible. Namely, it is advantageous to sufficiently increase a minimum angle $\theta 1$ (see FIG. 4) that is defined by a line L1, which passes, in the cross sections of FIGS. 4 to 6 perpendicular to the sheet plane of the deposition mask 20, the connection portion 41 having the minimum cross-sectional area of the through-hole 25 and another given position of the wall surface 31 of the first recess 30, with respect to the normal direction of the deposition mask 20.

One of possible methods of increasing the angle $\theta 1$ is that the thickness of the deposition mask 20 is reduced so that the height of the wall surface 31 of the first recess 30 and the height of the wall surface 36 of the second recess 35 are reduced. Namely, it can be said that the metal plate 21, which has a thickness as small as possible within a range in which the strength of the deposition mask 20 is ensured, is preferably used as the metal plate 21 constituting the deposition mask 20.

As another possible method of increasing the angle $\theta 1$ is that the outline of the first recess 30 is made optimum. For example, according to this embodiment, since the wall surfaces 31 of the two adjacent first recesses 30 are merged with each other, the angle $\theta 1$ is allowed to be significantly large (see FIG. 4), as compared with a recess that does not merge with another recess, whose wall surfaces (outlines) are shown by the dotted lines. A reason therefor is described below.

As described in detail later, the first recess 30 is formed by etching the first surface 21a of the metal plate 21. In general, a wall surface of the recess formed by etching has a curved shape projecting toward the erosion direction. Thus, the wall surface 31 of the recess formed by etching is steep in. an area where the etching starts, and is relatively largely inclined in an area opposed to the area where the etching starts, i.e., the at the deepest point of the recess. On the other hand, in the illustrated deposition mask 20, since the wall surfaces 31 of the two adjacent first recesses 30 merge on the side where the etching starts, an outline of a portion 43 where distal edges 32 of the wall surfaces 31 of the two first recesses 30 are merged with each other has a chamfered shape instead of a steep shape. Thus, the wall surface 31 of the first recess 30 forming a large part of the through-hole 25 can be effectively inclined with respect to the normal direction of the deposition mask. That is to say, the angle $\theta 1$ can be made large.

According to the deposition mask 20 in the present invention, the inclination angle $\theta 1$ formed by the wall surface 31 of the first recess 30 with respect to the normal direction of the deposition mask can be effectively increased, in the whole effective area 22. Thus, the deposition in a desired pattern can be precisely and stably performed, while the utilization efficiency of the deposition material 98 can be effectively improved.

(Material)

A material (metal plate) for constituting the above-described deposition mask 20 is described below. In order to obtain the deposition mask 20 having a reduced thickness, it is necessary to increase a reduction ratio when a metal plate is manufactured by rolling a base plate. However, the larger the reduction ratio is, the larger a stress remaining inside the metal plate, i.e., a remaining stress becomes. A method of heating the metal plate is known as a method for removing such a remaining stress. When the remaining stress is removed by the heating operation, there is a possibility that the dimension of the outline the metal plate changes. For example, the dimension in the longitudinal direction of the metal plate may reduce after the heating of the metal plate. This is because the removal of the remaining stress inside the metal plate invites removal of the remaining strain, and/or the change of crystalline orientation invites change of the crystalline density. In the below description, the phenomenon in which the dimension of the outline of the metal plate changes because of heat is also referred to as "thermal recovery".

A step of manufacturing the deposition masks 20 by use of a metal plate includes a step of applying heat to the metal plate. For example, in a step of forming a resist film on a metal plate, a coating liquid containing a negative-type photosensitive resist material is firstly applied to the metal plate, and then the coating liquid is dried by heat. At this time, since the heat is applied to the metal plate, the remaining strain may be possibly removed. In addition, in a step of developing the resist film, the resist film is sometimes heated so as to increase a hardness of the resist film. Also at this time, since heat is applied to the metal plate, the remaining strain may be possibly removed. Thus, in the manufacturing process of a deposition mask, the aforementioned thermal recovery of the metal plate might occur. In addition, in a deposition step using the deposition mask 20, predetermined heat is applied to the deposition mask 20, so that the thermal recovery might occur.

When the removal of remaining strain because of heat uniformly occurs irrespective of a position on the metal plate 21, the thermal recovery of the metal plate 21 also uniformly occurs irrespective of a position on the metal plate 21. Namely, a change ratio (contraction ratio) of a distance between two given target points on the metal plate 21 is the same irrespective of the target point positions. On the other hand, when the removal of remaining strain because of heat non-uniformly occurs depending on a position on the metal plate 21, the thermal recovery of the metal plate 21 also non-uniformly occurs depending on a position on the metal plate 21. Namely, a change ratio (contraction ratio) of a distance between two given target points on the metal plate 21 differs depending on the target point positions on the metal plate 21. In the below description, the thermal recovery that uniformly occurs irrespectively of a position is referred to as "uniform thermal recovery", while the thermal recovery that non-uniformly occurs depending on a position is referred to as "non-uniform thermal recovery".

Problems that can be caused by the "non-uniform thermal recovery" of the metal plate are studied below.

As shown in FIG. 1, in the deposition step using the deposition mask 20, a plurality of the deposition masks 20 are attached to the frame 15. Each deposition mask 20 is held by the frame 15 in a tensed state. Thus, when the thermal recovery of the metal plate 21 in the longitudinal direction uniformly occurs irrespective of a position in the width direction, the length of the deposition mask 20 with respect to the frame 15 upon attachment can be adjusted by adjusting a tensing amount. Namely, the positions of the through-holes 25 in the deposition mask 20 with respect to the frame 15 can be ideally adjusted.

On the other hand, when the thermal recovery of the metal plate 21 in the longitudinal direction non-uniformly occurs in the width direction, the positions of the through-holes 25 in each deposition mask 20 with respect to the frame 15 cannot be ideally adjusted even by uniformly tensing a plurality of the deposition masks 20. In addition, a difference between the thermal recovery degrees of the metal plate 21 in the respective deposition masks 20 is so small that the difference cannot be visually confirmed. Thus, it is difficult to ideally adjust the positions of the through-holes 25 of the respective deposition masks 20 with respect to the frame 15 by independently adjusting the tensing amounts of the respective deposition masks 20. Thus, when the thermal recovery of the metal plate 21 in the longitudinal direction non-uniformly occurs in the width direction, positions of light emitting layers of organic EL display devices, which are manufactured by the deposition step using the deposition masks 20, vary depending on dispersion of degrees of thermal recovery that occurred in the deposition masks 20. This invites the dispersion of quality of the organic EL display devices.

Under these circumstances, it is important to select and use a metal plate having a small dispersion of thermal recovery amounts in the width direction. As described above, the thermal recovery in the manufacturing process of the deposition masks 20 is caused by the remaining strain inside the used metal plate. Thus, the use of a metal plate having a small dispersion of thermal recovery amounts in the width direction corresponds to the use of a metal plate having a small dispersion of remaining strain amounts in the width direction.

Next, an operation and an effect of this embodiment as structured above are described. Here, a method of manufacturing a metal plate for use in manufacturing a deposition mask firstly. Then, a method of manufacturing a deposition mask by use of the obtained metal plate is described. Thereafter, a method of depositing a deposition material onto a substrate by use of the obtained deposition mask.

(Method of Manufacturing Metal Plate)

Figure 7A:
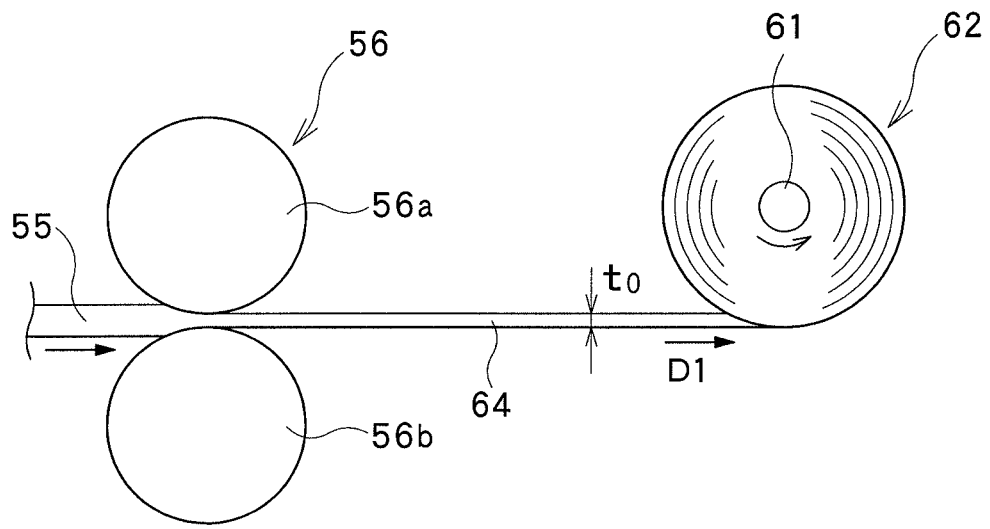
FIG. 7A is a view showing a step of rolling a base metal to obtain a metal plate having a desired thickness.
Figure 7B:
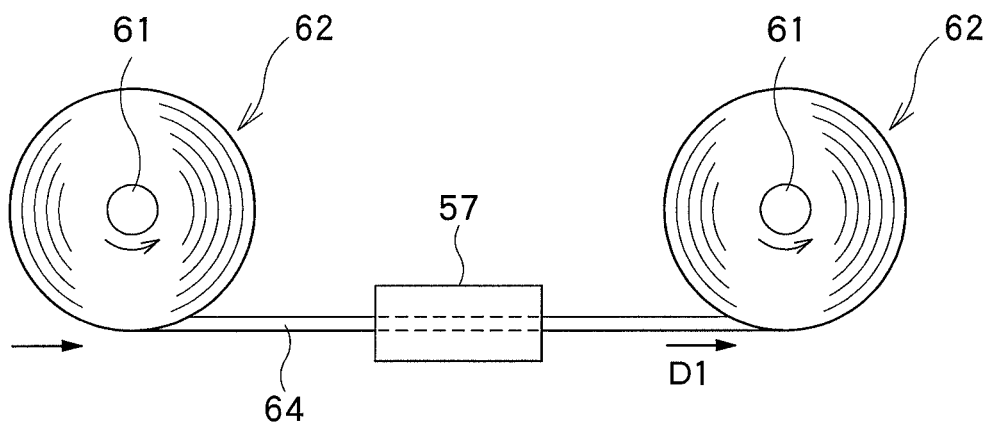
FIG. 7B is a view showing a step of annealing the metal plate obtained by the rolling operation.

A method of manufacturing a metal plate is firstly described with reference to FIGS. 7A, 7B, FIGS. 8A, 8B, 8C, FIGS. 9A, 9B (a) and 9B (b). FIG. 7A is a view showing a step of obtaining a metal plate having a desired thickness. FIG. 7B is a view showing a step of annealing the metal plate obtained by the rolling process.

<Rolling Step>

As shown in FIG. 7A, a base metal 55 formed of an invar alloy is prepared, and the base metal 55 is transported toward a rolling apparatus 56 including a pair of reduction rolls 56a and 56b along a transport direction shown by the arrow D1. The base metal 55 having reached between the pair of reduction rolls 56a and 56b is rolled by the pair of reduction rolls 56a and 56b. Thus, a thickness of the base metal 55 is reduced and is elongated along the transport direction. As a result, an elongated metal plate 64 having a thickness $t_0$ can be obtained. As shown in FIG. 7A, a winding body 62 may be formed by winding up the elongated metal plate 64 around a core 61. Although a value of the thickness $t_0$ is not particularly limited, the value is not less than 0.020 mm and not more than 0.100 mm, for example.

FIG. 7A merely shows the rolling step schematically, and a concrete structure and procedure for performing the rolling step are not specifically limited. For example, the rolling step may include a hot rolling step in which the base metal is processed at a temperature not less than a temperature at which a crystalline orientation of the invar alloy constituting the base metal 55 is changed, and a cold rolling step in which the base metal 55 is processed at a temperature not more than a temperature at which the crystalline orientation of the invar alloy is changed.

<Slitting Step>

After that, there may be performed a slitting step for slitting both ends of the elongated metal plate 64, which is obtained by the rolling step, in the width direction thereof, over a range of not less than 3 mm and not more than 5 mm. The slitting step is performed to remove a crack that may be generated on both ends of the elongated metal plate 64 because of the rolling step. Due to the slitting step, it can be prevented that a breakage phenomenon of the elongated metal plate 64, which is so-called plate incision, occurs from the crack as a starting point.

<Annealing Step>

After that, in order to remove a remaining stress accumulated by the rolling process in the elongated metal plate 64, as shown in FIG. 7B, the elongated metal plate 64 is annealed by using an annealing apparatus 57. As shown in FIG. 7B, the annealing step may be performed while the elongated metal plate 64 is being pulled in the transport direction (longitudinal direction). Namely, the annealing step may be performed as a continuous annealing process while the elongated metal plate is being transported, instead of a batch-type annealing process. A duration of the annealing step is suitably set depending on a thickness of the elongated metal plate 64 and a reduction ratio thereof. For example, the annealing step is performed at 500° C. for 60 seconds. The above "60 seconds" mean that it takes 60 seconds for the elongated metal plate 64 to pass through a space, which is heated at 500° C., in the annealing apparatus 57.

Due to the annealing step, it is possible to obtain the elongated metal plate 64 of a thickness $t_0$, from which the remaining strain is removed to a certain extent. The thickness $t_0$ is generally equal to a maximum thickness Tb in the surrounding area 23 of the deposition mask 20.

The elongated metal plate 64 having the thickness $t_0$ may be made by repeating the above rolling step, the slitting step and the annealing step plural times. FIG. 7B shows the example in which the annealing step is performed while the elongated metal plate 64 is being pulled in the longitudinal direction. However, not limited thereto, the annealing step may be performed to the elongated metal plate 64 that is wound around the core 61. Namely, the batch-type annealing process may be performed. When the annealing step is performed while the elongated metal plate 64 is wound around the core 61, the elongated metal plate 64 may have a warping tendency corresponding to a winding diameter of the winding body 62. Thus, depending on a winding diameter of the winding body 62 and/or a material forming the base metal 55, it is advantageous to perform the annealing step while the elongated metal plate 64 is being pulled in the longitudinal direction.

The aforementioned continuous annealing process is advantageous in that a throughput of the step can be improved as compared with the batch-type annealing process, but is disadvantageous in that the remaining strain is insufficiently removed as compared with the batch-type annealing process. Namely, the above-described thermal recovery is more likely to occur when the continuous annealing process is performed rather than when the batch-type annealing process is performed.

<Cutting Step>

After that, there is performed a cutting step of cutting off both ends of the elongated metal plate 64 in the width direction thereof over a predetermined range, so as to adjust the width of the elongated metal plate 64 into a desired width. Thus, the elongated metal plate 64 having a desired thickness and a desired width can be obtained.

<Inspection Step>

Figure 8A:
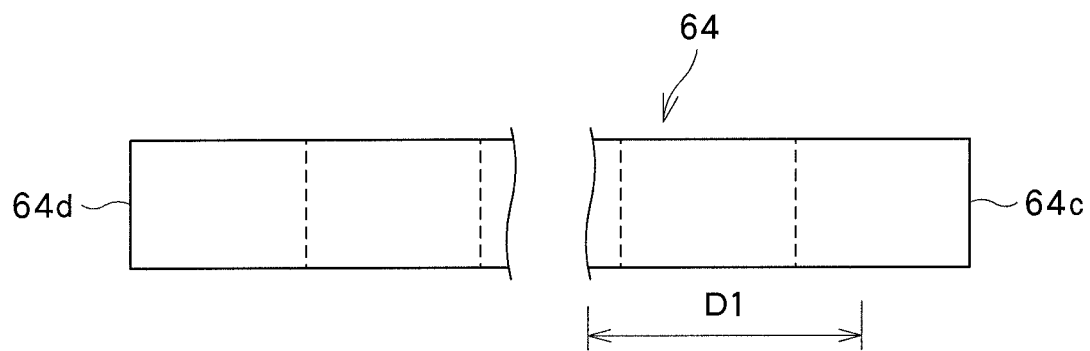
FIG. 8A is a plan view showing an elongated metal plate.
Figure 8B:
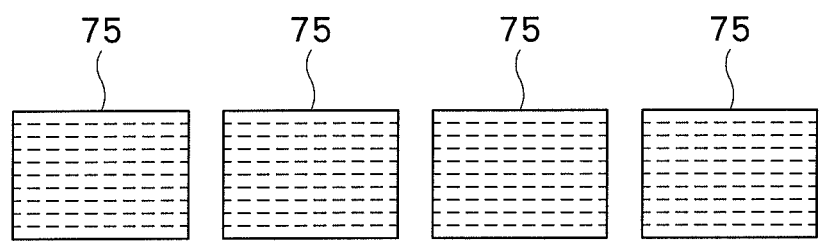
FIG. 8B is a plan view showing sample metal plates cut out from the elongated metal plate.

After that, there is performed an inspection step in which a sample, which was taken out from the obtained elongated metal plate 64, is inspected before and after a heat treatment to know a thermal recovery degree. FIG. 8A is a plan view showing the obtained elongated metal plate 64. In FIG. 8A, a forward end of the elongated metal plate 64 in the longitudinal direction is shown by the symbol 64c, and a rearward end thereof is shown by the symbol 64d. In the inspection step, the elongated metal plate 64 is firstly cut along the width direction of the elongated metal plate 64, so that a sample metal plate 75 having a predetermined length in the longitudinal direction is obtained. At least one sample metal plate 75 is cut out from the elongated metal plate 64 constituting one winding body 62. As shown by the dotted lines in FIG. 8A, two sample metal plates 75 are cut out in the forward end 64c of the elongated metal plate 64, and two sample plates 75 are cut out in the rearward end 64d of the elongated metal plate 64. FIG. 8B shows four sample metal plates 75 cut out from one elongated metal plate 64.

Figure 8C:
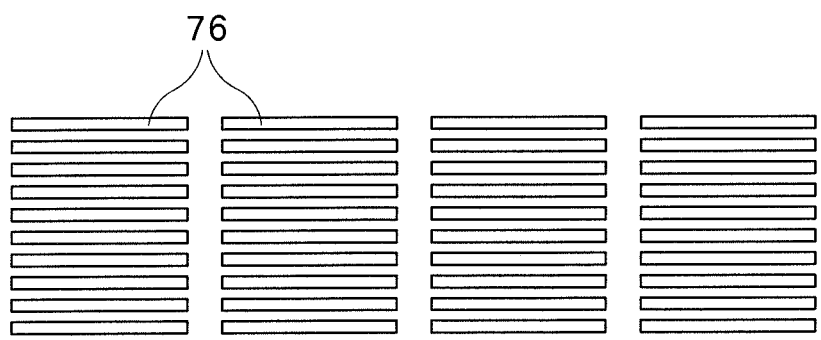
FIG. 8C is a plan view showing samples cut out from the sample metal plates.

Then, each sample metal plate 75 is cut in the longitudinal direction of the metal plate to obtain a plurality of samples 76. For example, as shown by the dotted lines in FIG. 8B, each sample metal plate 75 is divided equally into ten in the width direction. FIG. 8C shows forty samples 76 in total, which are cut out from the four sample metal plates 75.

Figure 9A:
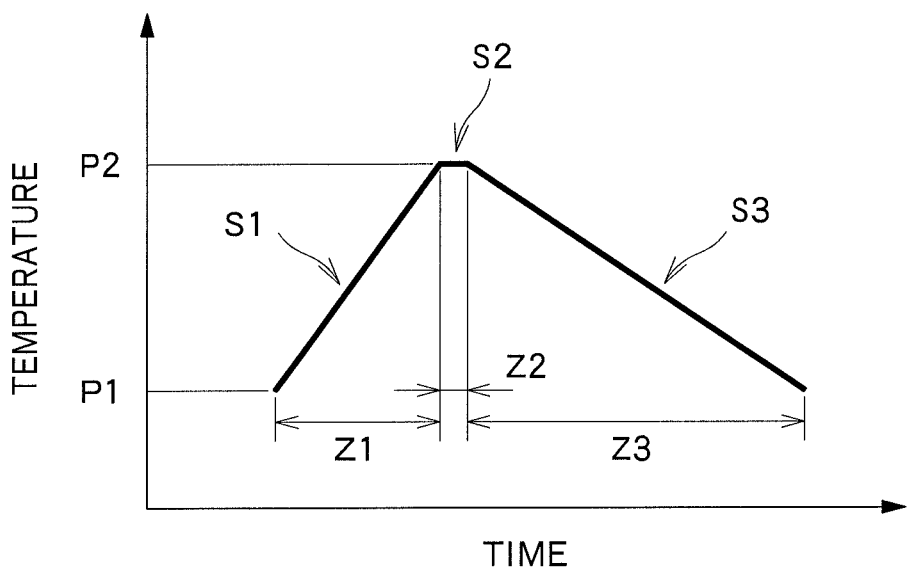
FIG. 9A is a view showing a heat treatment applied to the sample.

Thereafter, before and after the sample 76 is subjected to a heat treatment, a distance between two measurement points 76a on each sample 76 is measured at a temperature of 25° C. As shown in FIG. 9A, the heat treatment includes a first step S1 of increasing a temperature of each sample 76 from P1 to P2 for a period of time Z1, a second step S2 of keeping the temperature of each sample 76 at P2 for a period of time Z2, and a third step S3 of decreasing the temperature of each sample 76 from P2 to P1 for a period of time Z3. The periods of time Z1, Z2, Z3 and the temperatures P1 and P2 are set to simulate heat to be applied to the metal plate 21 in the manufacturing process of the deposition mask 20. For example, Z1, Z2, Z3 are respectively set as 30 minutes, 50 minutes and 60 minutes. The temperatures P1 and P2 are respectively set at normal temperature (e.g., 25° C.) and 300° C.

In the first step, as shown in FIG. 9A, the sample 76 is heated such that its temperature is increased from the temperature P1 (25° C.) to the temperature (300° C.) at a uniform speed (temperature increase speed). Similarly, in the third step, the sample 76 is cooled such that its temperature is decreased from the temperature P2 (300° C.) to the temperature P1 (25° C.) at a uniform speed (temperature decrease speed).

Figure 9B:
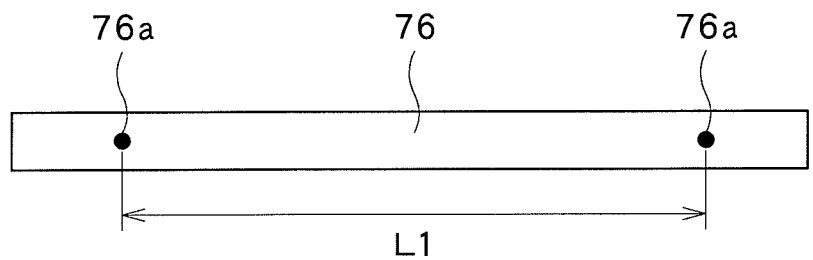
FIG. 9B (a) is a plan view showing the sample before it is subjected to the heat treatment.
Figure 9B:
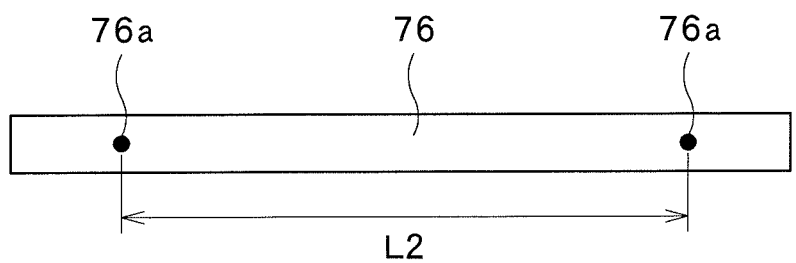

FIG. 9B (a) is a plan view showing the sample 76 before it is subjected to the heat treatment, and FIG. 9B (b) is a plan view showing the sample 76 after it is subjected to the heat treatment. In FIGS. 9B (a) and 9B (b), a distance between the two points 76a in the longitudinal direction of the sample 76, i.e., in the longitudinal direction of the elongated metal 64, before the sample 76 is subjected to the heat treatment is shown by the symbol L1, and a distance therebetween after the sample 76 is subjected to the heat treatment is shown by the symbol L2. The two measurement points 76a are set such that the distance L1 on the sample 76 before it is subjected to the heat treatment is an appropriate distance for evaluation of a thermal recovery degree of each sample 76, for example, about 500 mm. In FIGS. 9B (a) and 9B (b), the difference between the distances L1 and L2 is overstated than in reality as a matter of convenience in explanation.

In FIGS. 9B (a) and 9B (b), the two measurement points 76a are aligned along the longitudinal direction of the sample 76. However, as long as the thermal recovery of the sample 76 can be adequately observed, the arrangement of the measurement points 76a is not specifically limited.

A method of marking the two measurement points 76a is not specifically limited. For example, the measurement points 76a are marked as scratches formed in the sample 76.

Before the heat treatment, the distance L1 between the two measurement points 76a in the longitudinal direction of the sample 76 is measured. In addition, after the heat treatment, the distance L2 therebetween is measured. Thereafter, a thermal recovery rate F of the sample 76 is calculated based on the following expression.

$$F=\{(L1-L2)/L1\}\times 10^6 \text{ (unit: ppm)}$$

The thermal recovery rate F is defined as parts per million of a difference between the distance L1 before the heat treatment and the distance L2 after the heat treatment, relative to the distance L1 between the two measurement points 76a on the sample 76 before it is subjected to the heat treatment. For example, when L1 is 500 mm and L2 is 499.995 mm, the thermal recovery rate F is +10 ppm. Measurements of the distances L1 and L2 are performed at a temperature of P1, i.e., at a normal temperature (25° C.).

The aforementioned elongated metal plate may have a corrugation that is caused by the fact that an elongation percentage differs depending on a position in the width direction during the rolling step. When there is such a corrugation, the above-described lengths L1 and L2 may be distances in consideration of the corrugation, which are obtained by scanning the surface of the sample 76 along the corrugation, or may be distances without considering the corrugation. In either measuring method, the thermal recovery degree of the sample 73 can be evaluated.

For example, the below-described examples show results in which the distances L1 and L2 on the sample 76 were measured with the use of an automatic two-dimensional coordinate measuring machine AMIC-710 manufactured by SINTO S-PRECISION, Ltd. In this case, the distances L1 and L2 are distances on an X-Y coordinate without considering the corrugation. The AMIC-710 machine includes a function of making constant an ambient temperature of an object to be measured, i.e., an ambient temperature of the sample 76. Thus, the use of the AMIC-710 machine enables stable measurement unsusceptible to an ambient temperature change.

Thereafter, selection of an elongated metal plate 64 is carried out based on a value of the obtained thermal recovery rate F. Herein, the selection of an elongated metal plate 64 is carried out in such a manner that only an elongated metal plate 64 that satisfies both the following conditions (1) and (2) is used in the below-described manufacturing process of the deposition mask 20.

(1) An average value K1 of the thermal recovery rates F of the respective samples 76 is not less than −10 ppm and not more than +10 ppm.

(2) A dispersion K2 of the thermal recovery rates F of the respective samples 76 is not more than 20 ppm.

The dispersion K2 of the thermal recovery rates F of the respective samples 76 is a value obtained by multiplying 3 to a standard deviation $\sigma_1$ of the thermal recovery rates F of the predetermined number of samples 76, e.g., forty samples 76. Namely, $3\sigma_1$ is employed as the dispersion K2.

The above condition (1) means that the average value K1 of the thermal recovery rates F of the respective samples 76 is sufficiently smaller than the positional precision required for the through-holes 25 of the deposition mask 20. Thus, by using the elongated metal plate 64 satisfying the condition (1), it can be prevented that the dimension of the metal plate 21 constituting the deposition masks 20 is changed because of the thermal recovery in such a degree that the quality of the deposition masks 20 is affected during the manufacturing process of the deposition masks 20. Thus, it is not necessary to adjust, for each lot, positions of the through-holes 25 to be formed in the metal plate 21 in consideration of the thermal recovery rate, and it is not necessary to adjust, for each lot, a tensing amount when the deposition masks 20 are attached to the frame in consideration of the thermal recovery rate.

The above condition (2) means that the dispersion K2 of the thermal recovery rates F of the respective samples 76 is sufficiently smaller than the positional precision required for the through-holes 25 of the deposition mask 20. Thus, by using the elongated metal plate 64 satisfying the condition (2), a dispersion of the positions of the through-holes 25 in a plurality of the deposition masks 20 obtained from one elongated metal plate 64 can be made within an allowable range. Thus, it can be restrained that a position of the deposition material, which is deposited on the substrate by the deposition step using the deposition masks 20 attached to the frame 15, varies in each individual deposition mask. Therefore, when pixels of an organic EL display device is formed by deposition, the positional precision of pixels of the organic EL display device can be improved. As a result, light emitting from each pixel can be taken out without any loss. Namely, a light emission efficiency of each pixel can be enhanced.

(Method of Manufacturing Deposition Mask)

Next, a method of manufacturing the deposition mask 20 by use of the elongated metal plate 64 selected as described above is described with reference to FIGS. 10 to 19. In the below-described method of manufacturing the deposition mask 20, as shown in FIG. 10, the elongated metal plate 64 is supplied, the through-holes 25 are formed in the elongated metal plate 64, and the elongated metal plate 64 are severed so that the deposition masks 20 each of which is formed of the sheet-like metal plate 21 are obtained.

To be more specific, the method of manufacturing a deposition mask 20 includes a step of supplying an elongated metal plate 64 that extends like a strip, a step of etching the elongated metal plate 64 using the photolithographic technique to form a first recess 30 in the elongated metal plate 64 from the side of a first surface 64a, and a step of etching the elongated metal plate 64 using the photolithographic technique to form a second recess 35 in the elongated metal plate 64 from the side of a second surface 64b. When the first recess 30 and the second recess 35, which are formed in the elongated metal plate 64, communicate with each other, the through-hole 25 is made in the elongated metal plate 64. In the example shown in FIG. 11, the step of forming the second recess 35 is performed before the step of forming the first recess. In addition, between the step of forming the second recess 35 and the step of forming the first recess 30, there is further provided a step of sealing the thus made second recess 35. Details of the respective steps are described below.

Figure 10:
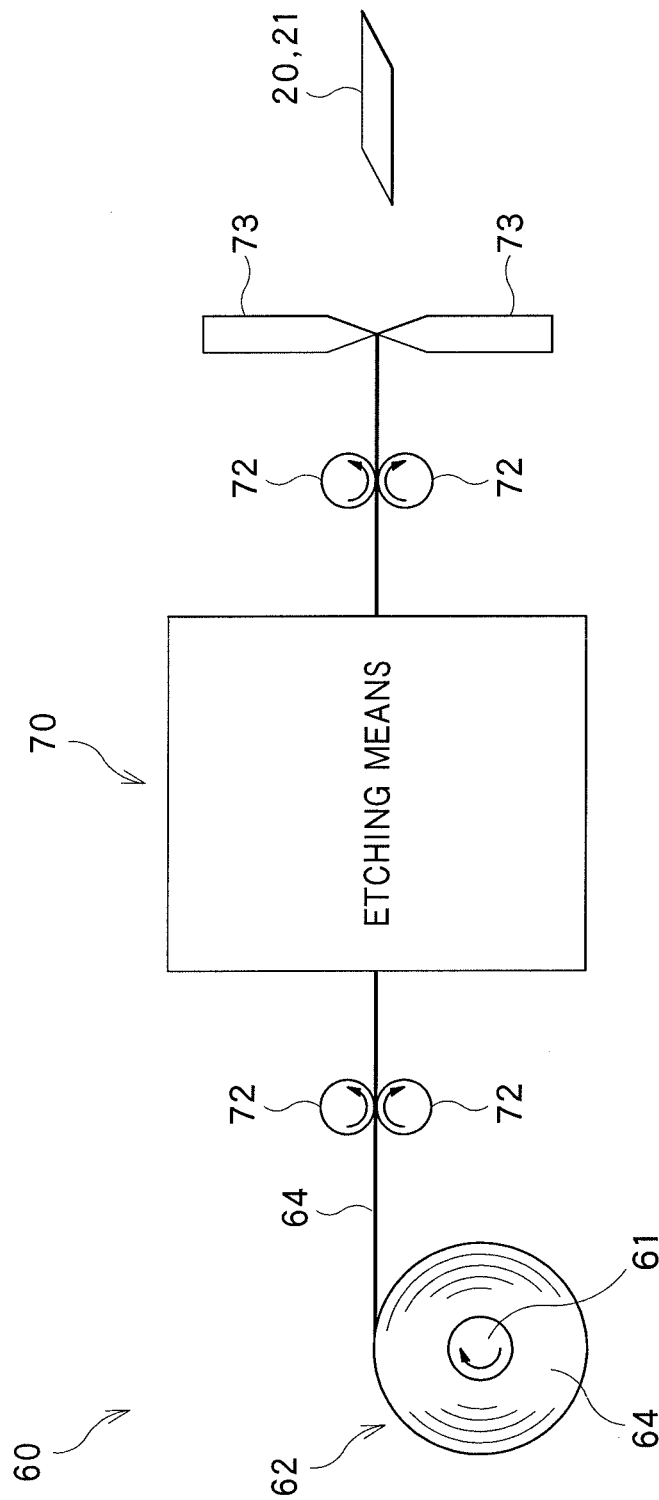
FIG. 10 is a diagrammatic view for generally explaining an example of a method of manufacturing a deposition mask shown in FIG. 1.

FIG. 10 shows a manufacturing apparatus 60 for making the deposition masks 20. As shown in FIG. 10, the winding body 62 having the core 61 around which the elongated metal plate 64 is wound is firstly prepared. By rotating the core 61 to unwind the winding body 62, the elongated metal plate 64 extending like a strip is supplied as shown in FIG. 10. After the through-holes 25 are formed in the elongated metal plate 64, the elongated metal plate 64 provides the sheet-like metal plate 21 and further the deposition masks 20.

The supplied elongated metal plate 64 is transported by the transport rollers 72 to an etching apparatus (etching means) 70. The respective processes shown in FIGS. 11 to 19 are performed by means of the etching means 70. In this embodiment, pluralities of the deposition masks 20 are assigned in the width direction of the elongated metal plate 64. Namely, the deposition masks 20 are made from an area occupying a predetermined position of the elongated metal plate 64 in the longitudinal direction. In this case, if the thermal recovery rate varies in the width direction of the elongated metal plate 64, the lengths of the deposition masks 20 to be obtained and below-described total pitches also vary.

Figure 11:
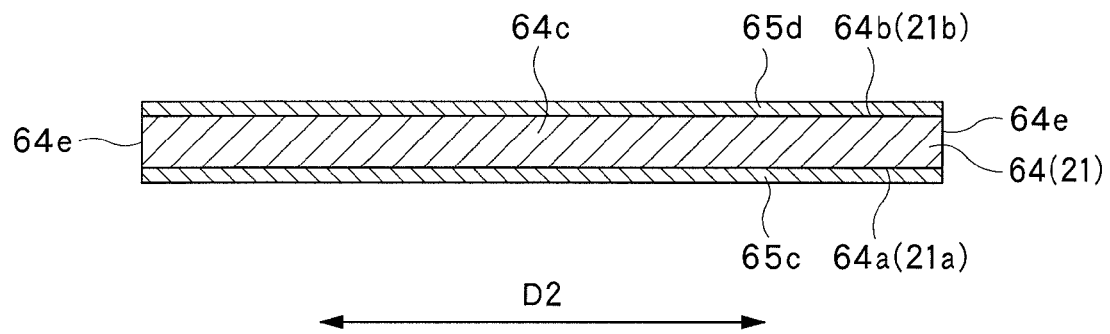
FIG. 11 is a view for explaining an example of the method of manufacturing a deposition mask, which is a sectional view showing a step of forming a resist film on a metal plate.

As shown in FIG. 11, a negative-type photosensitive resist material is firstly applied to the first surface 64a (lower surface in the sheet plane of FIG. 11) and the second surface 64b of the elongated metal plate 64, so that resist films 65c and 65d are formed on the elongated metal plate 64.

Figure 12:
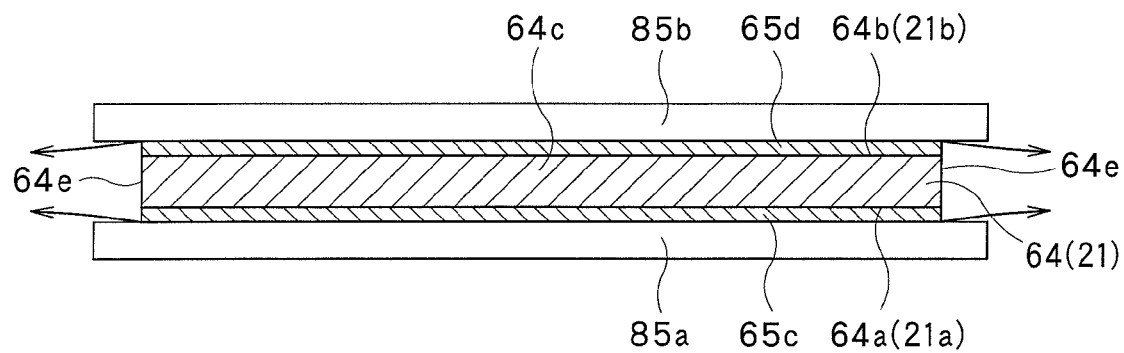
FIG. 12 is a view for explaining the example of the method of manufacturing a deposition mask, which is a sectional view showing a step of bringing an exposure mask into tight contact with the resist film.

Then, exposure masks 85a and 85b which do not allow light to transmit through areas to be removed of the resist films 65c and 65d are prepared. As shown in FIG. 12, the masks 85a and 85d are located on the resist films 65c and 65d. For example, glass dry plates which do not allow light to transmit through the areas to be removed from the resist films 65c and 65d are used as the exposure masks 85a and 85d. Thereafter, the exposure masks 85a and 85b are sufficiently brought into tight contact with the resist films 65c and 65d by vacuum bonding.

A positive-type photosensitive resist material may be used. In this case, there is used an exposure mask which allows light to transmit through an area to be removed of the resist film.

Figure 13:
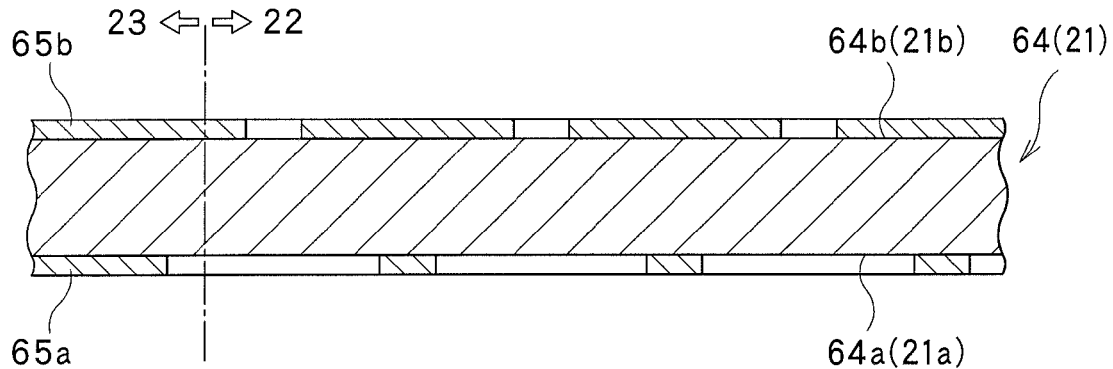
FIG. 13 is a view for explaining the example of the method of manufacturing a deposition mask, which is a view showing an elongated metal plate in a section along a normal direction.

After that, the resist films 65c and 65d are exposed through the exposure masks 85a and 85b. Then, the resist films 65c and 65d are developed (developing step) in order to form an image on the exposed resist films 65c and 65d. Thus, as shown in FIG. 13, a resist pattern (also referred to simply as resist) 65a can be formed on the first surface 64a of the elongated metal plate 64, while a resist pattern (also referred to simply as resist) 65b can be formed on the second surface 64b of the elongated metal plate 64. The developing step may include a resist heat treatment step of increasing a hardness of the resist films 65c and 65d. In the resist heat treatment step, the resist films are heated at a temperature of 300° C. for 5 minutes.

Figure 14:
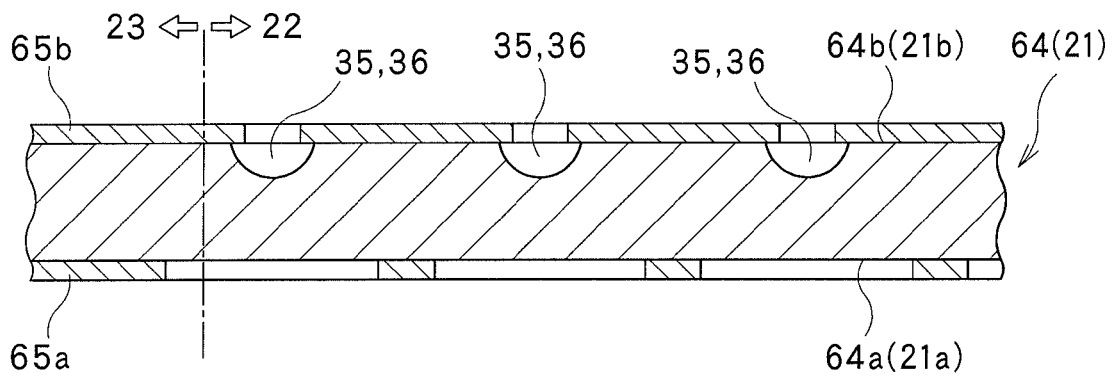
FIG. 14 is a view for explaining the example of the method of manufacturing a deposition mask, which is a view showing the elongated metal plate in the section along the normal direction.

Then, as shown in FIG. 14, by using an etching liquid (e.g., ferric chloride solution), the elongated metal plate 64 is etched from the side of the second surface 64b, with the resist pattern 65d formed on the elongated metal plate 64 serving as a mask. For example, the etching liquid is ejected from a nozzle, which is disposed on the side facing the second surface 64b of the transported elongated metal plate 64, toward the second surface 64b of the elongated metal plate 64 through the resist pattern 65b. As a result, as shown in FIG. 14, areas of the elongated metal plate 64, which are not covered with the resist pattern 65b, are eroded by the etching liquid. Thus, a lot of second recesses 35 are formed in the elongated metal plate 64 from the side of the second surface 64b.

Figure 15:
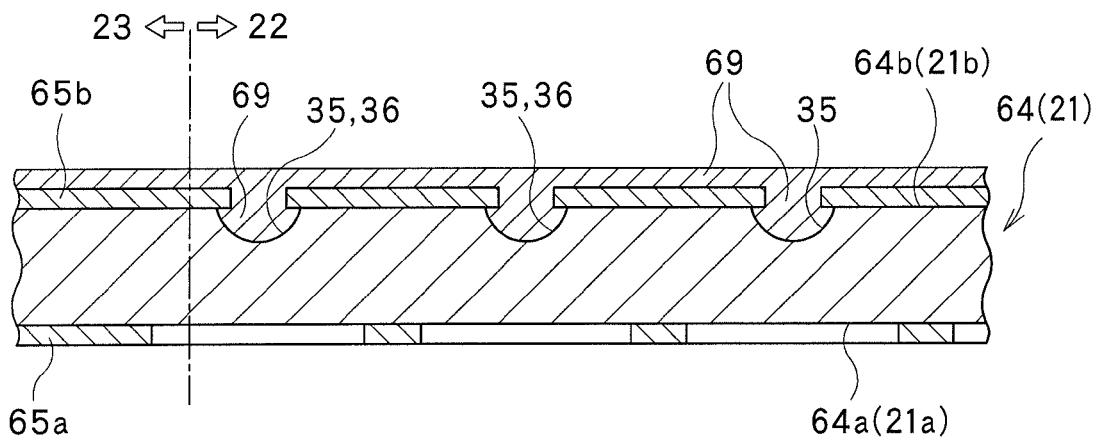
FIG. 15 is a view for explaining the example of the method of manufacturing a deposition mask, which is a view showing the elongated metal plate in the section along the normal direction.

After that, as shown in FIG. 15, the formed second recesses 35 are coated with a resin 69 resistant to the etching liquid. Namely, the second recesses 35 are sealed by the resin 69 resistant to the etching liquid. In the example shown in FIG. 15, a film of the resin 69 is formed to cover not only the formed second recesses 35 but also the second surface 64b (resist pattern 65b).

Figure 16:
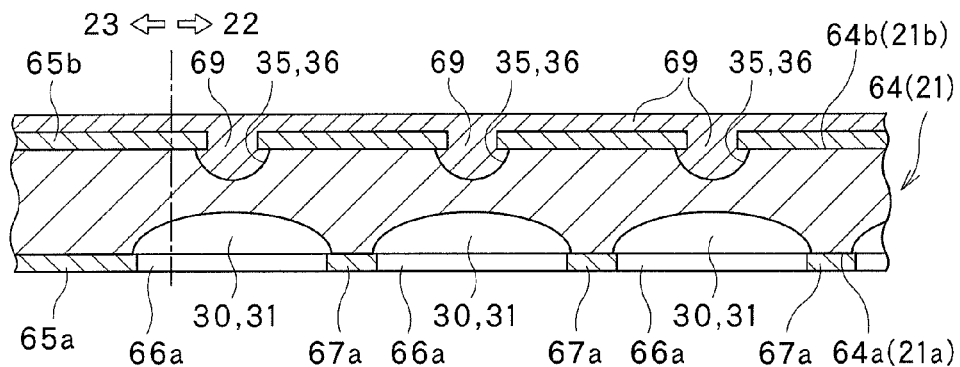
FIG. 16 is a view for explaining the example of the method of manufacturing a deposition mask, which is a view showing the elongated metal plate in the section along the normal direction.

Then, as shown in FIG. 16, the elongated metal plate 64 is subjected to the second etching process. In the second etching process, the elongated metal plate 64 is etched only from the side of the first surface 64a, so that the first recess 30 is gradually formed from the side of the first surface 64a. This is because the elongated metal plate 64 is coated with the resin 69 resistant to the etching liquid, on the side of the second surface 64b. Thus, there is no possibility that the second recesses 35, which have been formed to have a desired shape by the first etching process, are impaired.

Figure 17:
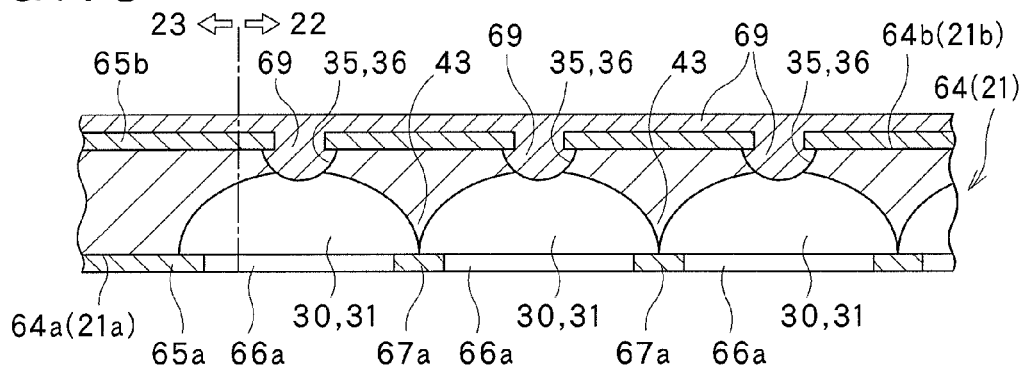
FIG. 17 is a view for explaining the example of the method of manufacturing a deposition mask, which is a view showing the elongated metal plate in the section along the normal direction.

The erosion by the etching process takes place in an area of the elongated metal plate 64, which is in contact with the etching liquid. Thus, the erosion develops not only in the normal direction (thickness direction) of the elongated metal plate 64 but also in a direction along the plate plane of the elongated metal plate 64. Thus, as shown in FIG. 17, with the development of etching in the normal direction of the elongated metal plate 64, not only the first recess 30 becomes continuous with the second recess 35, but also two first recesses 30, which are formed at positions facing two adjacent holes 66a of the resist pattern 65a, are merged with each other on a reverse side of a bridge portion 67a positioned between the two holes 66a.

Figure 18:
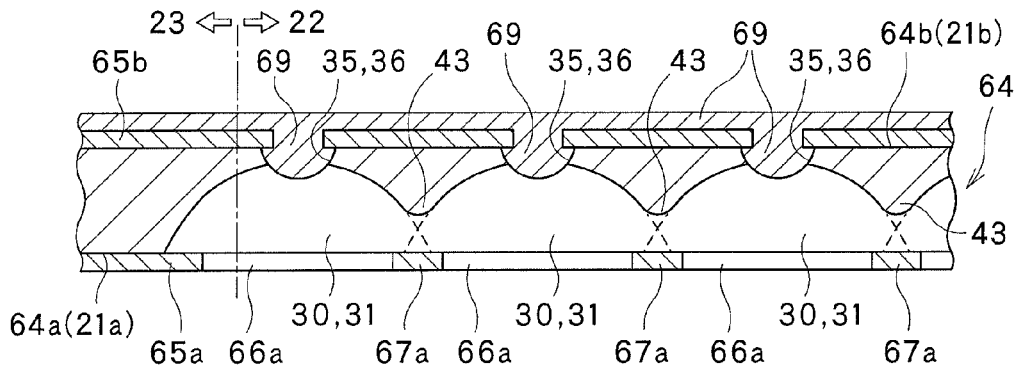
FIG. 18 is a view for explaining the example of the method of manufacturing a deposition mask, which is a view showing the elongated metal plate in the section along the normal direction.

As shown in FIG. 18, the etching from the side of the first surface 64a of the elongated metal plate 64 further develops. As shown in FIG. 18, a merged portion 43 where the two adjacent first recesses 30 are merged with each other is separated from the resist pattern 65a, and the erosion by the etching process develops also in the normal direction (thickness direction) of the metal plate 64 at the merged portion 43 below the resist pattern 65a. Thus, the merged portion 43, which is sharpened toward the one side along the normal direction of the deposition mask, is etched from the one side along the normal direction of the deposition mask, so that the merged portion 43 is chamfered as shown in FIG. 18. Thus, the inclination angle θ1, which is defined by the wall surface 31 of the first recess 30 with respect to the normal direction of the deposition mask, can be increased.

In this manner, the erosion of the first surface 64a of the elongated metal plate 64 by the etching process develops in the whole area forming the effective area 22 of the elongated metal plate 64. Thus, a maximum thickness Ta along the normal direction of the elongated metal plate 64, in the area forming the effective area 22, becomes smaller than a maximum thickness Tb of the elongated metal plate 64 before being etched.

When the etching process from the side of the first surface 64a of the elongated metal plate 64 develops by a preset amount, the second etching process to the elongated metal plate 64 is ended. At this time, the first recess 30 extends in the thickness direction of the elongated metal plate 64 up to a position where it reaches the second recess 35, whereby the through-hole 25 is formed in the elongated metal plate 64 by means of the first recess 30 and the second recess 35 that are in communication with each other.

Figure 19:
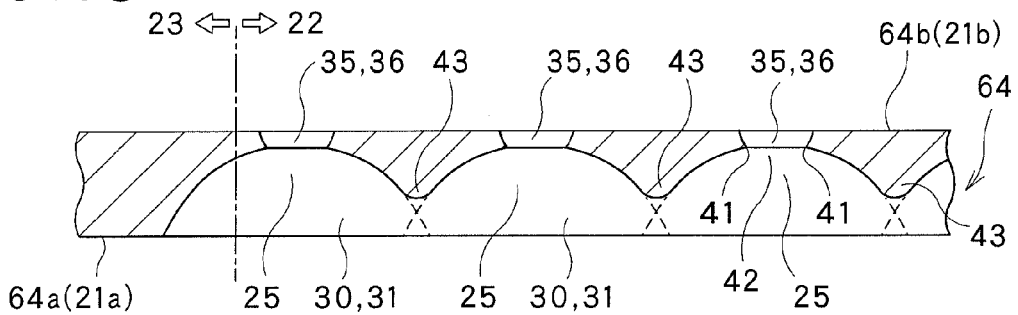
FIG. 19 is a view for explaining the example of the method of manufacturing a deposition mask, which is a view showing the elongated metal plate in the section along the normal direction.

After that, as shown in FIG. 19, the resin 69 is removed from the elongated metal plate 64. For example, the resin 69 can be removed by using an alkali-based peeling liquid. When the alkali-based peeling liquid is used, as shown in FIG. 19, the resist patterns 65a and 65b are removed simultaneously with the removal of the resin 69. However, after the removal of the resin 69, the resist patterns 65a and 65b may be removed separately from the resin 69.

The elongated metal plate 64 having a lot of through-holes 25 formed therein is transported to a cutting apparatus (cutting means) 73 by the transport rollers 72, 72 which are rotated while sandwiching therebetween the elongated metal plate 64. The above-described supply core 61 is rotated through a tension (tensile stress) that is applied by the rotation of the transport rollers 72, 72 to the elongated metal plate 64, so that the elongated metal plate 64 is supplied from the winding body 62.

Thereafter, the elongated metal plate 64 in which a lot of recesses 30, 35 are formed is cut by the cutting apparatus (cutting means) 73 to have a predetermined length and a predetermined width, whereby the sheet-like metal plate 21 having a lot of through-holes 25 can be obtained.

In this manner, the deposition mask 20 formed of the metal plate 21 having a lot of through-holes 25 can be obtained. According to this embodiment, the first surface 21a of the metal plate 21 is etched over the whole effective area 22. Thus, the thickness of the effective area 22 of the deposition mask 20 can be reduced, and the outline of the portion 43, where the distal edges 32 of the wall surfaces 31 of the two first recesses 30 formed on the side of the first surface 21a are merged with each other, can have a chamfered shape. As a result, the aforementioned angle θ1 can be increased, to thereby improve the utilization efficiency of the deposition material and the positional precision of deposition.

In addition, according to this embodiment, since the above conditions (1) and (2) are satisfied, there is used the elongated metal plate 64 in which the average value and the dispersion of the thermal recovery rates measured at the respective positions in the width direction D2 are restrained.

Therefore, it can be restrained that the positions of the through-holes 25 of a plurality of the deposition masks 20 obtained from the elongated metal plate 64 vary in each individual deposition mask.

(Deposition Method)

Next, a method of depositing the deposition material onto the substrate 92 by use of the obtained deposition mask 20 is described. As shown in FIG. 2, the deposition mask 20 is firstly brought into tight contact with the substrate 92. At this time, as shown in FIG. 1, the deposition masks 20 are attached to the frame 15 in a tensed state, so that the surface of each deposition mask 20 is in parallel with the surface of the substrate 92. According to this embodiment, there is used the elongated metal plate 64 that is selected beforehand based on the average value and the dispersion of the thermal recovery rates in the width direction of the elongated metal plate 64. Thus, as compared with a case in which such selection is not carried out, it can be restrained that the length of each deposition mask 20 differs from a designed value, and that lengths of a plurality of the masks 20 vary from one another. Thus, a deviation of the positions of the through-holes 25 of each deposition mask 20 with respect to the frame 15 from the designed value can be reduced. Therefore, the deposition material can be deposited onto the substrate 92 with high positional precision. Therefore, when pixels of an organic EL display device are formed by deposition, the dimensional precision and the positional precision of the pixels in the organic EL display device can be improved. As a result, light emitting from each pixel can be taken out without any loss. Namely, a light emission efficiency of each pixel can be enhanced.

In this embodiment, there is explained the example in which the first surface 21a of the metal plate 21 is etched over the whole effective area 22. However, not limited thereto, the first surface 21a of the metal plate 21 may be etched over only a part of the effective area 22.

Figure 20:
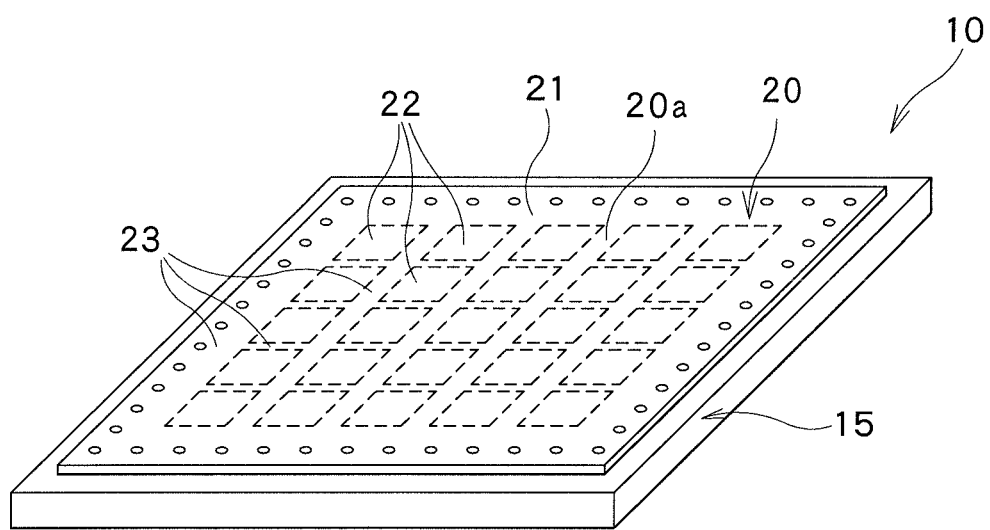
FIG. 20 is a view showing a modification example of the deposition mask apparatus including deposition masks.

In addition, in this embodiment, there is explained the example in which a plurality of the deposition mask 20 are assigned in the width direction of the elongated metal plate 64. In addition, there is explained the example in which a plurality of the deposition masks 20 are attached to the frame 15 in the deposition step. However, the present invention is not limited thereto. As shown in FIG. 20, a deposition mask 20 having a plurality of the effective areas 22, which are arranged like a grid along both the width direction and the longitudinal direction of the metal plate 21, may be used. Also in this case, by using the elongated metal plate 64 having the reduced dispersion of the thermal recovery rates in the width direction, it can be restrained that a degree of dimensional change caused by heat varies depending on a position in the width direction of the deposition mask 20. Therefore, the positional precision of the deposition material to be deposited onto the substrate can be improved.

EXAMPLES

Next, although the present invention is described in more detail referring to examples, the present invention is not limited to the below examples as long as it departs from the scope of the present invention.

(First Winding Body and First Sample)

Firstly, by performing the aforementioned rolling step, the slitting step, the annealing step and the cutting step were performed to the base metal made of the invar alloy, a winding body (first winding body) around which an elongated metal plate was wound was manufactured.

To be specific, a first rolling step, in which a first hot rolling step and a first cold rolling step were performed in this order, was firstly performed. Then, a first slitting step, in which both ends in the width direction of the elongated metal plate were slit over a range of not less than 3 mm and not more than mm, respectively, was performed. Thereafter, a first annealing step, in which the elongated metal plate was continuously annealed at 500° C. for 60 seconds, was performed. Further, a second rolling step including a second cold rolling step was performed to the elongated metal plate having underwent the first annealing step. Then, a second slitting step, in which both ends in the width direction of the elongated metal plate were slit over a range of not less than 3 and not more than 5 mm, respectively, was performed. Thereafter, a second annealing step, in which the elongated metal plate was continuously annealed at 500° C. for 60 seconds, was performed. Thus, the elongated metal plate 64 of about 600 mm in width, which has a desired thickness, was obtained. After that, a cutting step, in which both ends in the width direction of the elongated metal plate 64 were cut over a predetermined range, respectively, was performed such that the width of the elongated metal plate 64 was finally adjusted to a desired width, specifically, 500-mm width.

In the above cold rolling step, a pressure adjustment with a backup roller was performed. Specifically, the shape and the pressure of the backup roller of a rolling machine were adjusted such that the elongated metal plate 64 was bilaterally symmetric in shape. In addition, the cold rolling step was performed while being cooled with rolling oil such as coal oil. After the cold rolling step, a cleaning step, in which the elongated metal plate was cleaned with a hydrocarbon cleaning agent, was performed. After the cleaning step, the slitting step was performed.

After that, by cutting the elongated metal plate 64 along the width direction by means of a shearing cutter, a first sample metal plate made of a metal plate having a width of 500 mm and a projection length of 700 mm was obtained. Two first sample metal plates were cut out in the forward end of the elongated metal plate 64, and two first sample plates were cut out in the rearward end of the elongated metal plate 64. The "projection length" means a length of the metal plate (dimension in the rolling direction) when viewed from directly above, i.e., when a corrugation of the metal plate is discounted. The width of the first sample metal plate means a distance between a pair of ends of the first sample metal plate in the width direction. The pair of ends of the first sample metal plate are ends that have been formed by the cutting step in which the both ends in the width direction of the metal plate obtained by the rolling step and the annealing step, and extend substantially linearly.

Then, four first sample metal plates were divided equally into ten along the longitudinal direction. Thus, forty first samples in total each having a width of 50 mm and a projection length of 700 mm were obtained. Thereafter, each first sample was scratched by means of a needle to mark each first sample with two measurement points. The two measurement points were made such that a gap of about 500 mm was defined between the two measurement points in the longitudinal direction.

Then, the respective first samples were subjected to the heat treatment. Before and after the heat treatment, the distances L1 and L2 between the two measurement points in the longitudinal direction of each first sample were measured at a temperature of 25° C. In the heat treatment, the temperature of each first sample was increased from 25° C. to 300° C. for 30 minutes, then the temperature of each first sample was kept at 300° C. for 5 minutes, and thereafter the temperature of each first sample was decreased from 300° C. to 25° C. for 60 minutes. Herein, as a measuring machine that applied the heat treatment to each first sample and measured a distance between the two measurement points on each first sample, the above-described automatic two-dimensional coordinate measuring machine AMIC-710 manufactured by SINTO S-PRECISION, Ltd was used. In addition, the aforementioned thermal recovery rates F were calculated based on the measured distances L1 and L2.

After the measurement, it was found that the average value K1 of the thermal recovery rates F of the respective first samples was −2 ppm, and that the dispersion K2 of the thermal recovery rates was 16 ppm. By comparing these measurement results with the above conditions (1) and (2), it was found that the first sample satisfied both the conditions (1) and (2). Thus, it can be judged that the first winding body from which the first samples were taken out can be used as a material for manufacturing deposition masks.

(Evaluation of Primary Effect)

A lot of deposition masks each having five effective areas along the longitudinal direction were manufactured by using the elongated metal plate of the first winding body from which the above first samples were obtained. The respective effective areas of each deposition mask are provided with a number of through-holes in a regular arrangement. Then, in order to evaluate a positional precision of the obtained deposition masks, total pitches of the respective depositions masks were measured, and an average value and a dispersion of the total pitches were calculated.

Herein, the "total pitch" means a distance between predetermined two points on a deposition mask. The positions of the two points are not specifically limited, as long as the positional precision of a deposition mask can be evaluated. Herein, a distance between a predetermined mark which is formed in the vicinity of the effective area located on one end side of the deposition mask, and a predetermined mark which is formed in the vicinity of the effective area located on the other end side of the deposition mask, was measured as the total pitch. The total pitch in this case is about 600 mm in design.

Similarly to the case of the thermal recovery rate, a value obtained by multiplying 3 to a standard deviation $\sigma_2$ of measured values of the total pitches of the respective deposition masks, i.e., $3\sigma_2$ was employed as a reference of a dispersion degree of the total pitches.

The average value of the measurement values of the total pitches of the deposition masks obtained from the first winding body was 600.0018 mm and the dispersion ($3\sigma_2$) thereof was 9.3 The number of measurements for the calculation of the standard deviation ($\sigma_2$) was set such that the value of the standard deviation ($\sigma_2$) has sufficient degree of certainty for comparison between the deposition masks obtained from the first winding body and the deposition masks obtained from a second winding body to a tenth winding body described below. To be specific, the total pitch was measured at two positions on each of the forty first samples, whereby the number of measurements was set eighty. Allowance ranges of the average value and the dispersion of the measurement values of the total pitches of the deposition masks can be determined in consideration of a pixel density of an organic EL display device to be manufactured by use of the deposition masks. For example, when an organic EL display device having a pixel density of 400 ppi, for example, it is required that an average value of measurement values of total pitches of the deposition masks is within a range of a designed value (e.g., 600.0000 mm)±0.005 mm, and that a dispersion of the measurement values of the total pitches of the deposition masks is not more than 0.01 mm. Owing to this setting, a total pitch of an obtained deposition mask can be within a range of a designed value (e.g., 600.0000 mm)±0.005 mm, i.e., within an allowable range.

In addition, the total pitch of a deposition mask obtained from the first winding body was evaluated in terms of process capacity index. The process capacity index is a numerical value of a quantity achievement capacity of a process (process capacity). In general, when the process capacity index is not less than 1.33, it can be said that the process has a good quality achievement capacity.

Herebelow, a method of calculating the process capacity index is described. A process capacity index in which an average value of property values of an object to be manufactured as a result of a process can be adjusted is calculated by the following expression.

$$Cp=(USL-LSL)/(6\times\sigma_2)$$

USL and LSL respectively represent an upper specification value and a lower specification value. In this embodiment for example, as described above, since the allowance value of the total pitch is 600.0000 mm±0.015 mm, USL is 600.015 mm and LSL is 599.985 mm. The phrase "an average value of property values can be adjusted" means a case in which the average value of the property values can be made as an intermediate value between USL and LSL by adjustment of the process.

On the other hand, a process capacity index Cpk in which it is considered that the average value of the property values departs from the intermediate value between USL and LSL is calculated by the following expression.

$$Cpk = (1-k) \times Cp$$

The symbol k is calculated by the following expression.

$$k = \frac{\left|\frac{USL + LSL}{2} - \mu\right|}{\frac{USL - LSL}{2}}$$

Herein, μ is an average value of the total pitches of the deposition masks obtained from the first winding body.

In this example, the above Cpk is employed as the process capacity index. The process capacity index Cpk of the total pitches of the deposition masks obtained from the elongated metal plate of the first winding body was 1.42.

(Evaluation of Secondary Effect)

A deposition material was deposited on a substrate by using the deposition masks manufactured from the elongated metal plate of the first winding body. A pattern of a lot of through-holes formed in the used deposition masks is a stripe pattern adapted to a pixel density of 300 ppi. An organic luminescent material for green color emitting green-colored light was used as the deposition material. Thereafter, central coordinate positions of a plurality of green-colored luminescent layers formed of the organic luminescent material for green color were measured. Measurement of the central coordinate positions was carried out for nine green-colored luminescent layers out of a plurality of the green-colored luminescent layers formed based on one effective area of a deposition mask. Similarly to the above sample evaluation case, in the evaluation of ten deposition masks taken out from one elongated metal plate, if the number of effective areas present in one deposition mask is five, the number of green-colored luminescent layers to be measured is 450 (=10×5×9).

Deviation amounts from the designed value were calculated for the respective measured central coordinate positions. In addition, the standard deviation $\sigma_3$ of the deviation amounts was calculated. Then, it was judged whether the dispersion ($3\sigma_3$) of the deviation amounts was not more than an allowable value or not. At this time, the allowable value of the dispersion of the deviation amounts of the central coordinate positions was 10 μm. The measurement showed that the dispersion of the deviation amounts of the central coordinate positions was 8.7 μm. Namely, it was found that the positional precision of the deposition material was good.

(Second to Tenth Winding Bodies and Second to Tenth Samples)

Similarly to the first winding body, a second winding body to a tenth winding body were manufactured from a base metal formed of an invar alloy. Further, as to the second winding bodies to the tenth winding body, measurement of the thermal recovery rates of the samples taken out from the respective winding bodies, as well as the above evaluation of primary effect and the evaluation of secondary effect related to the deposition masks manufactured from the elongated metal plates of the respective winding bodies were carried out in the same manner by which the measurement and evaluation of the first winding body were carried out.

(Summary of Judgment Results of Respective Samples)

FIG. 21 shows measurement results of the thermal recovery rates of the respective samples taken out from the first winding body to the tenth winding body. As shown in FIG. 21, judgment results of the first, second, third and fifth samples were "acceptable". Namely, both of the conditions (1) and (2) were satisfied. On the other hand, judgment results of the fourth, sixth, seventh, eighth, ninth and tenth samples were "unacceptable". Namely, at least one of the above conditions (1) and (2) was not satisfied. To be specific, the above condition (1) was not satisfied in the seventh, eighth and ninth samples. The above condition (2) was not satisfied in the fourth and sixth samples. Neither the condition (1) nor the condition (2) was satisfied in the tenth sample.

(Summary of Evaluation Results of Primary Effect and Secondary Effect)

FIGS. 22 and 23 respectively show the evaluation results of the primary effect and the secondary effect related to the deposition masks manufactured from the elongated metal plates of the first winding body to the tenth winding body.

As shown in FIGS. 22 and 23, as to the deposition masks manufactured by the elongated metal plates obtained from the first, second, third and fifth winding bodies, both the judgment result of the primary effect and the judgment result of the secondary effect were "acceptable". Specifically, regarding the primary effect, as shown in FIG. 22, the average value of total pitches (TP) was within the range of 600.0000 mm±0.005 mm, the dispersion of TP was not more than 0.01 mm, and the process capacity index Cpk was not less than 1.33. Regarding the secondary effect, as shown in FIG. 23, the dispersion of the deviation amounts of the central coordinate positions of the manufactured green-colored luminescent layers was not more than 10 μm.

On the other hand, as to the deposition masks manufactured by the elongated metal plates obtained from the fourth, sixth seventh, eighth, ninth and tenth winding bodies, both the judgment result of primary effect evaluation and the judgment result of secondary effect evaluation were "unacceptable". Specifically, regarding the primary effect, the process capacity index Cpk was less than 1.33. Regarding the secondary effect, the dispersion of the deviation amounts of the central coordinate positions of the manufactured green-colored luminescent layers was greater than 10 Further, as to the deposition masks manufactured by using the elongated metal plates obtained from the sixth to tenth winding bodies, the average value of TP departed from the range of 600.0000 mm±0.005 mm. Regarding the deposition mask manufactured by using the elongated metal plate obtained from the tenth winding body, the dispersion of TP was greater than 0.01 mm.

As can be understood from the comparison of FIGS. 21, 22 and 23, the judgment result based on the above conditions (1) and (2) and the judgment result based on the primary effect and the secondary effect completely coincide to each other. Namely, by utilizing the above conditions (1) and (2), it is possible to select an elongated metal plate 64 capable of improving the process capacity index of the manufacturing process of deposition masks, and of forming luminescent layers with high positional precision. That is to say, the above conditions (1) and (2) are considered to be significantly influential judging method for selecting the elongated metal plate 64.

DESCRIPTION OF REFERENCE NUMERALS

20 Deposition mask
21 Metal plate
21a First surface of metal plate
21b Second surface of metal plate 22 Effective area
23 Surrounding area
25 Through-hole
30 First recess
31 Wall surface
35 Second recess
36 Wall surface
55 Base metal
56 Rolling apparatus
57 Annealing apparatus
61 Core
62 Winding body
64 Elongated metal plate
64a First surface of elongated metal plate
64b Second surface of elongated metal plate
65a, 65b Resist pattern
65c, 65d Resist film
85a, 85b Exposure mask

The invention claimed is:

1. A method of manufacturing a metal plate to be used for manufacturing a deposition mask by forming a plurality of through-holes in the metal plate, the method comprising:
    a rolling step of rolling a base metal to obtain the metal plate; and
    an annealing step of annealing the metal plate obtained by the rolling step;
    wherein:
    the through-holes of the deposition mask are formed by etching the metal plate,
    when a plurality of samples are taken out from the metal plate, a distance between two measurement points on each sample, which is measured before a heat treatment, is referred to as L1, a distance therebetween which is measured after the heat treatment is referred to as L2, and a thermal recovery rate F of each sample is defined by the following expression: $F=\{(L1-L2)/L1\}\times 10^6$ (ppm), the following conditions (1) and (2) are satisfied:
        (1) an average value of the thermal recovery rates of the respective samples is not less than −10 ppm and not more than +10 ppm; and
        (2) a dispersion of the thermal recovery rates of the respective samples is not more than 20 ppm;
    the samples are obtained by cutting at least one sample metal plate, which is obtained by cutting the metal plate along a width direction of the metal plate, into two or more along a longitudinal direction of the metal plate;
    the two measurement points on the sample are aligned along the longitudinal direction of the metal plate;
    the heat treatment includes a first step of increasing a temperature of each sample from 25° C. to 300° C. for 30 minutes, a second step of keeping the temperature of each sample at 300° C. for 5 minutes, and a third step of decreasing the temperature of each sample from 300° C. to 25° C. for 60 minutes; and
    the dispersion of the thermal recovery rates is a value obtained by multiplying 3 to a standard deviation of the thermal recovery rates of the respective samples.

2. The method of manufacturing a metal plate according to claim 1, wherein
    the base metal includes an invar alloy.

3. The method of manufacturing a metal plate according to claim 1, wherein
    the annealing step is performed while pulling the rolled base metal in the longitudinal direction.

4. The method of manufacturing a metal plate according to claim 3, wherein
    the base metal includes an invar alloy.

5. The method of manufacturing a metal plate according to claim 1, wherein
    the annealing step is performed to the metal plate wound around a core.

6. The method of manufacturing a metal plate according to claim 5, wherein
    the base metal includes an invar alloy.

7. A method of manufacturing a deposition mask having a plurality of through-holes formed therein, comprising:
    a step of preparing a metal plate;
    a resist pattern forming step of forming a resist pattern on the metal plate; and
    an etching step of etching an area of the metal plate, which is not covered with the resist pattern, to form recesses in the metal plate, the recesses being configured to define the through-holes;
    wherein:
    when a plurality of samples are taken out from the metal plate, a distance between two measurement points on each sample, which is measured before a heat treatment, is referred to as L1, a distance therebetween which is measured after the heat treatment is referred to as L2, and a thermal recovery rate F of each sample is defined by the following expression: $F=\{(L1-L2)/L1\}\times 10^6$ (ppm), the following conditions (1) and (2) are satisfied:
        (1) an average value of the thermal recovery rates of the respective samples is not less than −10 ppm and not more than +10 ppm; and
        (2) a dispersion of the thermal recovery rates of the respective samples is not more than 20 ppm;
    the samples are obtained by cutting at least one sample metal plate, which is obtained by cutting the metal plate along a width direction of the metal plate, into two or more along a longitudinal direction of the metal plate;
    the two measurement points on the sample are aligned along the longitudinal direction of the metal plate;
    the heat treatment includes a first step of increasing a temperature of each sample from 25° C. to 300° C. for 30 minutes, a second step of keeping the temperature of each sample at 300° C. for 5 minutes, and a third step of decreasing the temperature of each sample from 300° C. to 25° C. for 60 minutes; and
    the dispersion of the thermal recovery rates is a value obtained by multiplying 3 to a standard deviation of the thermal recovery rates of the respective samples.

8. The method of manufacturing a deposition mask according to claim 7,
    the metal plate includes an invar alloy.

9. The method of manufacturing a deposition mask according to claim 7, wherein
    the resist-pattern forming step includes:
    a step of forming a resist film on the metal plate;
    a step of bringing an exposure mask into vacuum contact with the resist film;
    a step of exposing the resist film in a predetermined pattern through the exposure mask; and
    a developing step of forming an image on the exposed resist film;
    wherein the developing step includes a resist heat treatment step of increasing a hardness of the resist film.

10. The method of manufacturing a deposition mask according to claim 9,
    the metal plate includes an invar alloy.

* * * * *